(12) United States Patent
Beaujuge et al.

(10) Patent No.: US 9,356,241 B2
(45) Date of Patent: May 31, 2016

(54) END-GROUP-DIRECTED SELF-ASSEMBLY OF ORGANIC COMPOUNDS USEFUL FOR PHOTOVOLTAIC APPLICATIONS

(71) Applicant: The Regents of the University of California, Oakland, CA (US)

(72) Inventors: Pierre M. Beaujuge, Berkeley, CA (US); Olivia P. Lee, Berkeley, CA (US); Alan T. Yiu, Berkeley, CA (US); Jean M. J. Frechet, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 552 days.

(21) Appl. No.: 13/651,285

(22) Filed: Oct. 12, 2012

(65) Prior Publication Data

US 2014/0060636 A1 Mar. 6, 2014

Related U.S. Application Data

(60) Provisional application No. 61/546,977, filed on Oct. 13, 2011.

(51) Int. Cl.
*H01L 51/00* (2006.01)
*H01L 51/42* (2006.01)

(52) U.S. Cl.
CPC ........ *H01L 51/0061* (2013.01); *H01L 51/0053* (2013.01); *H01L 51/0054* (2013.01); *H01L 51/0072* (2013.01); *H01L 51/0068* (2013.01); *H01L 51/0074* (2013.01); *H01L 51/4253* (2013.01); *Y02E 10/549* (2013.01)

(58) Field of Classification Search
USPC .................... 136/256, 263; 548/453, 433
See application file for complete search history.

(56) References Cited

U.S. PATENT DOCUMENTS

| | | | |
|---|---|---|---|
| 2004/0151944 A1* | 8/2004 | Onikubo et al. | 428/690 |
| 2007/0059556 A1* | 3/2007 | Kim et al. | 428/690 |
| 2014/0128618 A1* | 5/2014 | Hayoz et al. | 548/453 |
| 2014/0217329 A1* | 8/2014 | Hayoz et al. | 252/500 |

OTHER PUBLICATIONS

Arias A.C. et al., Materials and Applications for Large Area Electronics: Solution-Based Approaches. Chem. Rev. 110, 3-24 (2010).
Bijleveld J.C. et al., Poly(diketopyrrolopyrrole-terthiophene) for Ambipolar Logic and Photovoltaics. J. Am. Chem. Soc. 131, 16616-16617 (2009).
Bürckstümmer H. et al., Tailored merocyanine dyes for solution-processed BHJ solar cells. J. Mater. Chem. 20, 240-243 (2010).
Chen H.Y. et al., Polymer solar cells with enhanced open-circuit voltage and efficiency. Nat. Photon. 3, (11), 649-653 (2009).

(Continued)

*Primary Examiner* — Ling Choi
*Assistant Examiner* — Catherine S Branch
(74) *Attorney, Agent, or Firm* — Robin C. Chiang; Lawrence Berkeley National Laboratory

(57) ABSTRACT

The present invention provides for an organic compound comprising electron deficient unit covalently linked to two or more electron rich units. The present invention also provides for a device comprising the organic compound, such as a light-emitting diode, thin-film transistor, chemical biosensor, non-emissive electrochromic, memory device, photovoltaic cells, or the like.

39 Claims, 12 Drawing Sheets

(56) References Cited

OTHER PUBLICATIONS

Coventry D. N. et al., Selective Ir-catalysed borylation of polycyclic aromatic hydrocarbons: structures of naphthalene-2,6-bis(boronate), pyrene-2,7-bis(boronate) and perylene-2,5,8,11-tetra(boronate) esters. Chem. Commun. 2172-74 (2005.

Hains A.W. et al., Molecular Semiconductors in Organic Photovoltaic Cells. Chem. Rev. 110, 6689-6735 (2010).

Huang A. et al., Steam-Stable Zeolitic Imidazolate Framework ZIF-90 Membrane with Hydrogen Selectivity through Covalent Functionalization. J. Am. Chem. Soc. 132, (44), 15562-15564 (2010).

Kagayama H. et al., High-Performance Organic Photovoltaic Devices Using a New Amorphous Molecular Material with High Hole Drift Mobility, Tris[4-(5-phenylthiophen-2-yl)phenyl]amine. Adv. Funct. Mater. 19, 3948-3955 (2009).

Kim M. et al., Effective Variables to Control the Fill Factor of Organic Photovoltaic Cells. ACS Appl. Mater. Interfaces. 1, 1264-1269 (2009).

Kline R.J. et al., Dependence of Regioregular Poly(3-hexylthiophene) Film Morphology and Field-Effect Mobility on Molecular Weight. Macromolecules, 38, 3312-3319 (2005).

Liang Y. and Yu L., A New Class of Semiconducting Polymers for Bulk Heterojunction Solar Cells with Exceptionally High Performance. Acc. Chem. Res. 43, 1227-1236 (2010).

Liang Y. et al., For the Bright Future—Bulk Heterojunction Polymer Solar Cells with Power Conversion Efficiency of 7.4%. Adv. Mater. 22, E135-E138 (2010).

Loser S. et al., A Naphthodithiophene-Diketopyrrolopyrrole Donor Molecule for Efficient Solution-Processed Solar Cells. J. Am. Chem. Soc. 133 (21), 8142-8145 (2011).

Mkhalid I. A. I. et al., C-H Activation for the Construction of C-B Bonds. Chem. Rev. 110, 890-931 (2009).

Morton C.J.H. et al., Synthetic studies related to diketopyrrolopyrrole (DPP) pigments. Part 2: The use of esters in place of nitriles in standard DPP syntheses: Claisen-type acylations and furopyrrole intermediates. Tetrahedron. 61, 727-738 (2005).

Müller C. et al., Influence of Molecular Weight on the Performance of Organic Solar Cells Based on a Fluorene Derivative. Adv. Funct. Mater. 20, 2124-2131 (2010).

Palilis L.C. et al., Organic photovoltaic cells with high open circuit voltages based on pentacene derivatives. Org. Electron. 9, 747-752 (2008).

Piliego C. et al., Synthetic Control of Structural Order in N-Alkylthieno[3,4-c]pyrrole-4,6-dione-Based Polymers for Efficient Solar Cells. J. Am. Chem. Soc. 132, 7595-7597 (2010).

Rajaram S. et al., Effect of Addition of a Diblock Copolymer on Blend Morphology and Performance of Poly(3-hexylthiophene):Perylene Diimide Solar Cells. Chem. Mater. 21, (9), 1775-1777 (2009).

Roncali J. Molecular Bulk Heterojunctions: An Emerging Approach to Organic Solar Cells. Acc. Chem. Res. 42, 1719-1730 (2009).

Shang H. et al., A Solution-Processable Star-Shaped Molecule for High-Performance Organic Solar Cells. Adv. Mater. 23, (13), 1554-1557 (2011).

Shin R. Y. C. et al., Electron-Accepting Conjugated Materials Based on 2-Vinyl-4,5-dicyanoimidazoles for Application in Organic Electronics. J. Org. Chem. 74, 3293-3298 (2009).

Sonar P. et al., A Low-Bandgap Diketopyrrolopyrrole-BenzothiadiazoleBased Copolymer for High-Mobility Ambipolar Organic Thin-Film Transistors. Adv. Mater. 22, 5409-5413 (2010).

Szarko J.M. et al., When Function Follows Form: Effects of Donor Copolymer Side Chains on Film Morphology and BHJ Solar Cell Performance. Adv. Mater. 22, 5468-5472 (2010).

Tamayo A. B. et al., A low band gap, solution processable oligothiophene with a dialkylated diketopyrrolopyrrole chromophore for use in bulk heterojunction solar cells. Appl. Phys. Lett. 94, (10), 103301 (2009).

Tang W. et al., Recent development of conjugated oligomers for high-efficiency bulk-heterojunction solar cells. Sol. Energ. Mat. Sol. C. 94, 1963-1979 (2010).

Thompson B.C. and J. M. J. Fréchet. Polymer—Fullerene Composite Solar Cells. Angew. Chem. Int. Ed. 47, 58-77 (2008).

Tong M. et al., Higher Molecular Weight Leads to Improved Photoresponsivity, Charge Transport and Interfacial Ordering in a Narrow Bandgap Semiconducting Polymer. Adv. Funct. Mater. 20, 3959-3965 (2010).

Wagner J. et al., High Fill Factor and Open Circuit Voltage in Organic Photovoltaic Cells with Diindenoperylene as Donor Material. Adv. Funct. Mater. 20, 4295-4303 (2010).

Walker B. et al., Nanoscale Phase Separation and High Photovoltaic Efficiency in Solution-Processed, Small-Molecule Bulk Heterojunction Solar Cells. Adv. Funct. Mater. 19, (19), 3063-3069 (2009).

Walker B. et al., Small Molecule Solution-Processed Bulk Heterojunction Solar Cells. Chem. Mater. 23, 470-482 (2011).

Wang E. et al., An Easily Synthesized Blue Polymer for High-Performance Polymer Solar Cells. Adv. Mater. 22, (46), 5240-5244 (2010).

Wienk M. M. et al., Narrow-Bandgap Diketo-Pyrrolo-Pyrrole Polymer Solar Cells: The Effect of Processing on the Performance. Adv. Mater. 20, 2556-2560 (2008).

Wong W. W. H. et al., Solution Processable Fluorenyl Hexa-peri-hexabenzocoronenes in Organic Field-Effect Transistors and Solar Cells. Adv. Funct. Mater. 20, 927-938 (2010).

Zen A. et al., Effect of Molecular Weight and Annealing of Poly(3-hexylthiophene)s on the Performance of Organic Field-Effect Transistors. Adv. Funct. Mater. 14, 757-764 (2004).

Zhao X. et al., Solution-Processable Crystalline Platinum-Acetylide Oligomers with Broadband Absorption for Photovoltaic Cells. Chem. Mater. 22, (7), 2325-2332 (2010).

\* cited by examiner

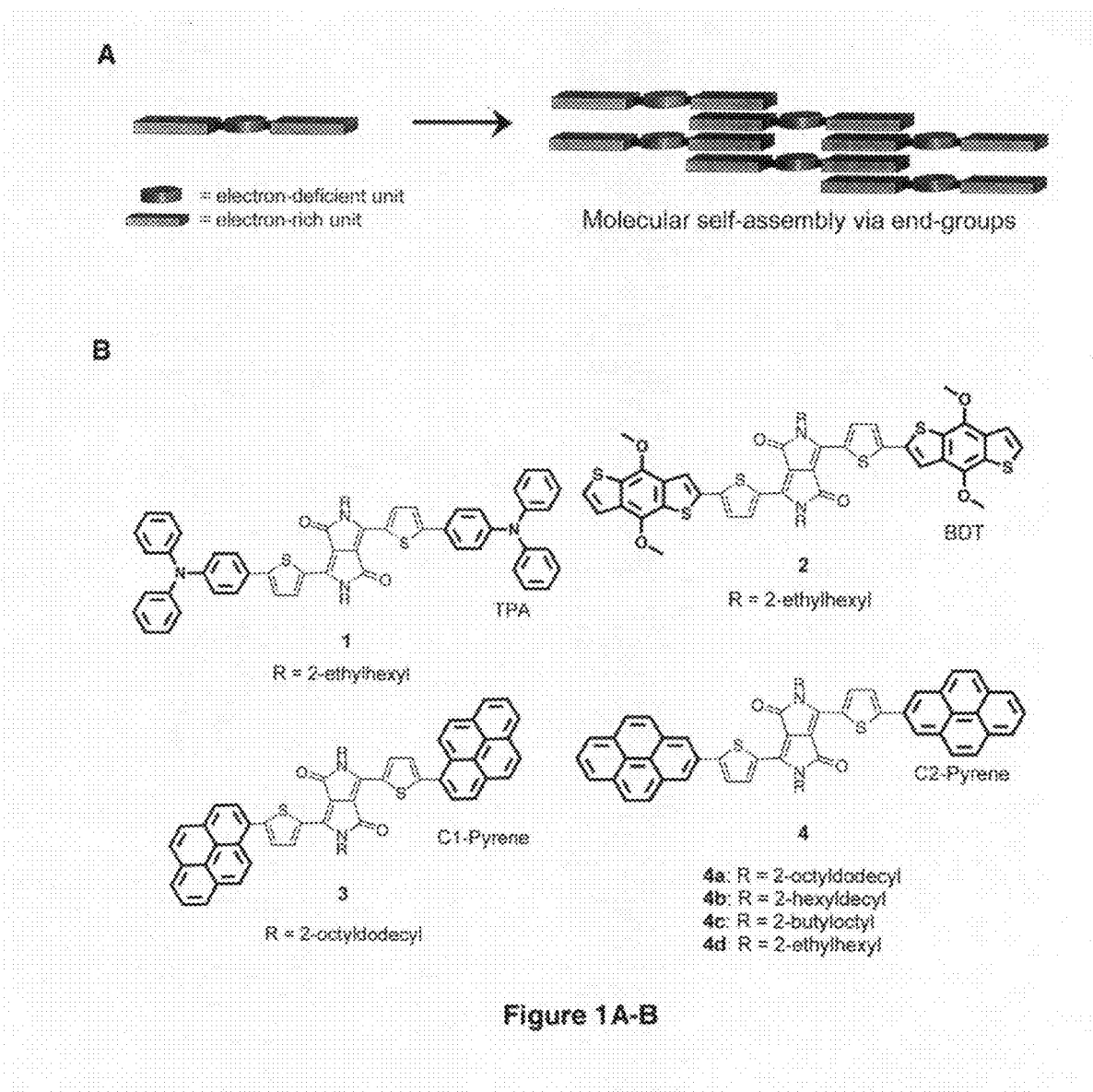
Figure 1A-B

END-GROUP-DIRECTED SELF-ASSEMBLY OF ORGANIC COMPOUNDS USEFUL FOR PHOTOVOLTAIC APPLICATIONS

RELATED PATENT APPLICATIONS

The application claims priority to U.S. Provisional Patent Application Ser. No. 61/546,977, filed Oct. 13, 2011, which is hereby incorporated by reference in its entirety.

STATEMENT OF GOVERNMENTAL SUPPORT

The invention was made with government support under Contract Nos. DE-AC02-05CH11231 awarded by the U.S. Department of Energy. The government has certain rights in the invention.

FIELD OF THE INVENTION

The present invention is in the field of photovoltaics.

BACKGROUND OF THE INVENTION

Currently, pi-conjugated polymers represent the most promising electron-donor materials for application in solution-processed organic bulk-heterojunction solar cell devices. Recently published studies (Nat. Photon. 2009, 3, (11), 649-653; J. Am. Chem. Soc. 2010, 132, (44), 15547-15549; Adv. Mater. 2010, 22, (46), 5240-5244) suggest that solar power conversion efficiencies on the order of those achieved with amorphous silicon technologies (ca. 10%) will be accessible upon identifying (i) proper molecular design and (ii) optimum device architecture. Nonetheless, a number of limitations encountered with conjugated polymers include: (i) batch-to-batch molecular weight and polydispersity variations, (ii) tedious material purifications, (iii) time-intensive syntheses, and (iv) solubility often limited to a small number of organic solvents. In contrast, conjugated small molecules are monodispersed, can be synthesized and purified with ease, and may ultimately be solution-processed from a variety of organic and aqueous solvents upon selecting proper solubilizing substituents.

Our work has been directed to introducing a design principle that would allow π-conjugated conjugated small molecules to arrange in an "end-to-end" fashion so as to mimic a polymeric backbone. In comparison with polymeric backbones which are composed of a multiplicity of covalently bound repeat units able to delocalize and transport charges with efficacy in a thin-film device, the degree of connectivity between conjugated small molecules is typically low and the charge transport in devices remains a critical limiting-parameter to date. Therefore, only a small number of reports (Adv. Funct. Mater. 2009, 19, (19), 3063-3069; Chem. Mater. 2010, 22, (7), 2325-2332; Appl. Phys. Lett. 2009, 94, (10), 103301; Adv. Mater. 2011, ASAP, DOI: 10.1002/adma.201004445) have described small molecules that yield power conversion efficiencies superior to 3% so far. The combination of (i) a lack of intermolecular connectivity and (ii) the formation of overly crystalline morphologies with domain-sizes exceeding the exciton diffusion length in thin-film devices, is known to be the bottle-neck of small molecule OPV device performance. In this regard, the identification of design principles that would allow for (i) enhancing the charge percolating pathway between molecules, (ii) tailoring the degree of microstructural order in small molecules in devices, and (iii) limiting the size of the crystalline domains formed across the active layer, is critically needed for this technology to compete with existing high-performing polymer solar cells strategies.

To the best of our knowledge, explicit strategies that promote intermolecular connectivity in order to mimic the material properties and photovoltaic device performance of a polymer backbone have not been described to date. Only strategies aimed at reducing the domain size of the small molecule crystallites formed during post-processing annealing treatments have been reported so far (e.g. Chem. Mater. 2009, 21, (9), 1775-1777). None of these reports describe a design principle that introduces the synthesis of conjugated small molecules which would arrange in an ordered "end-to-end" fashion, thus mimicking the backbone continuum of a conjugated polymer.

SUMMARY OF THE INVENTION

The present invention provides for an organic compound comprising electron deficient unit X covalently linked to two or more electron rich units. In some embodiments, the organic compound comprises X covalently linked to two, three, four, or more electron rich units. Each electron rich unit has the chemical structure of $-\gamma_n-\alpha$ or $-\gamma_n-\beta$. When the organic compound has two electron rich units, the organic compound comprises the following structure: $\alpha-\gamma_n-X-\gamma_n-\beta$. X comprises a multi-ring organic structure. Each γ is independently a covalent bond, thiophene, furan, or pyrrole, and each n is independently an integer from 0 to 20, or 1 to 20, or 1 to 10, or 1 to 5. α and β each independently comprise multi-ring aromatic structures which are each capable of π-stacking with the α and β of a second organic compound, wherein the organic compound and second organic compound can have identical or different chemical structures. In some embodiments, α and β are identical such that the organic compound has the structure: $\alpha-\gamma_n-X-\gamma_n-\alpha$. The present invention also provides for a plurality of the organic compound, wherein each organic compound is capable of π-stacking with another organic compound. The plurality of the organic compound can be a plurality of the organic compounds with the identical structure, or a plurality of the organic compounds with different structures. In some embodiments, the plurality of the organic compounds comprises each organic compound π-stacked with at least one other organic compound. The organic compound can be any compound described herein.

The present invention provides for organic compounds that comprise peripheral substituents (e.g. end-groups) that create strong and selective pi-pi interactions to promote the self-assembly of a multiplicity of finite molecular entities. Such finite molecular entities arrange in several directions through space via the cofacially-stacked peripheral substituents, and in turn mimic polymeric networks with efficient charge transport properties, high fill-factors and power conversion efficiencies in organic solar cells.

The invention also provides for a method of making the organic compound of the present invention comprising a method described herein.

The invention also provides for a composition or a device comprising a plurality of the organic compound of the present invention. In some embodiments, the device is a light-emitting diode, thin-film transistor, chemical biosensor, non-emissive electrochromic, memory device, photovoltaic cells, or the like. In some embodiments, the device comprises (a) a plurality of the organic compound of the present invention which is a p-type component (i.e. electron-donor) and (b) a suitable n-type component (i.e. electron-acceptor). In some embodiments, the device is an electronic device, such as a field-effect transistor, memory device, radio-frequency identification tag, sensor, and any other device that would involve a requirement of efficient charge-transport.

The invention also provides for a photovoltaic device comprising a photoactive layer comprising a plurality of the organic compound of the present invention disposed between a first electrode and a second electrode. In some embodiments, the first electrode is ITO. In some embodiments, the second electrode is LiF/Al. In some embodiments, the photoactive layer, the first electrode, and the second electrode are thin films. In some embodiments, the thin films are disposed on a suitable substrate. In some embodiments, the substrate comprises glass.

The present invention provides for maximizing solar cell device fill-factors and power conversion efficiencies by (i) increasing intermolecular connectivity and charge transport in conjugated small-molecule-based thin-films, and (ii) limiting the size of the crystalline domains formed across the thin-films.

The present invention provides for a controlled approach to achieve high-performance organic solar cells with efficiencies comparable to those achieved with conjugated polymers, such as described in U.S. Provisional Patent Application Ser. No. 61/388,479.

The present invention provides for a conjugated small molecule synthesized with various peripheral substituents, and tested in solar cell devices. The best results so far obtained are for planar and symmetrical polycyclic aromatic substituents, such as pyrene. As demonstrated by single-crystal X-ray diffraction, the resulting molecules are shown to crystallize in an "end-to-end" fashion via the pyrene substituents, thus mimicking the backbone continuum of a conjugated polymer.

In some embodiments, the organic compound of the present invention is capable of absorbing light. In some embodiments, the organic compound of the present invention, when in a photovoltaic device, such as a solar cell, are capable of conducting charges perpendicular to the film.

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION OF THE INVENTION

Figure 1C:
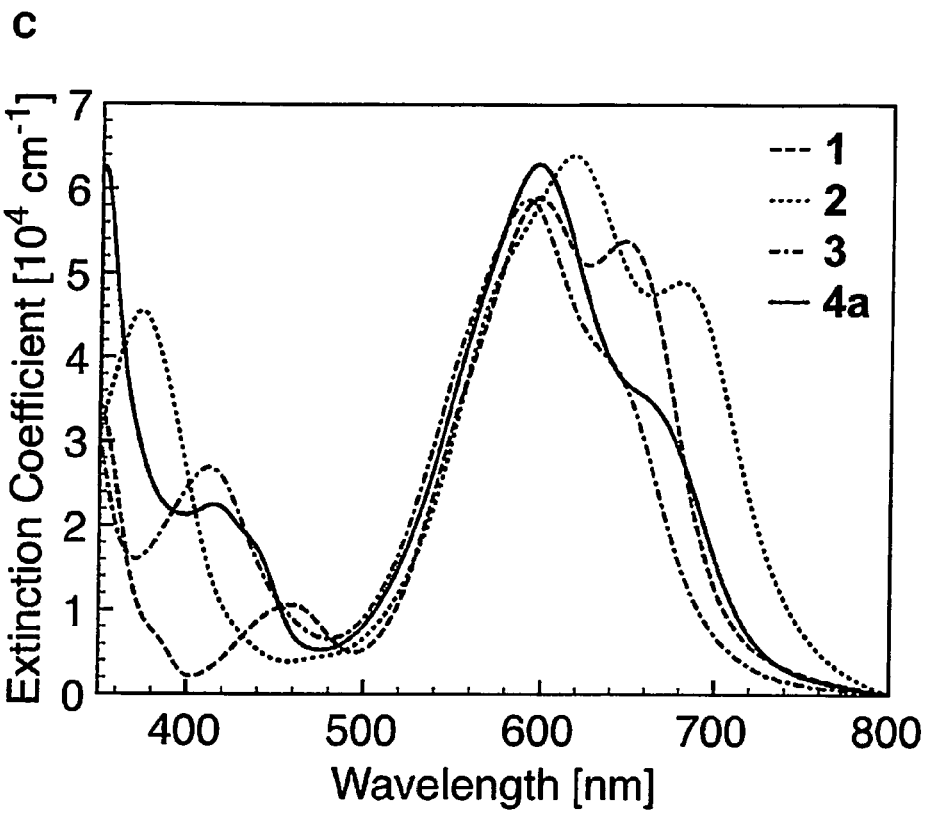
FIG. 1. (A) Donor-acceptor small molecules are designed to self-assemble through the electron-rich π-stacking units (top). (B) Molecules 1, 2, 3, and 4 based on a DPP core moiety flanked by electron-rich end-groups (bottom left) and (C) UV-Vis absorption spectra of 1, 2, 3, and 4a spin-coated as thin films (bottom right).

Before the invention is described in detail, it is to be understood that, unless otherwise indicated, this invention is not limited to particular sequences, expression vectors, enzymes, host microorganisms, or processes, as such may vary. It is also to be understood that the terminology used herein is for purposes of describing particular embodiments only, and is not intended to be limiting.

As used in the specification and the appended claims, the singular forms "a," "an," and "the" include plural referents unless the context clearly dictates otherwise. Thus, for example, reference to an "organic compound" includes a single organic compound as well as a plurality of organic compounds, either the same (e.g., the same molecule) or different.

In this specification and in the claims that follow, reference will be made to a number of terms that shall be defined to have the following meanings:

The terms "optional" or "optionally" as used herein mean that the subsequently described feature or structure may or may not be present, or that the subsequently described event or circumstance may or may not occur, and that the description includes instances where a particular feature or structure is present and instances where the feature or structure is absent, or instances where the event or circumstance occurs and instances where it does not.

X is an electron deficient unit. X is a chromophore comprising one or more electron-rich (or donor) heterocycles, one or more electron-poor (or acceptor) heterocycles, or a combination thereof. Each γ is independently

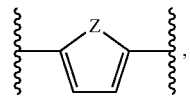

wherein Z is —S—, —O—, or —NH—.

In some embodiments, $\gamma_n$-X-$\gamma_n$ or X comprises at least one benzene, imide, pyrrole, furan, or thiophene. In some embodiments, X has one line of symmetry, or a 2-fold rotational symmetry (including or excluding the structure of R1 and R2). In some embodiments, X has one of the following structure:

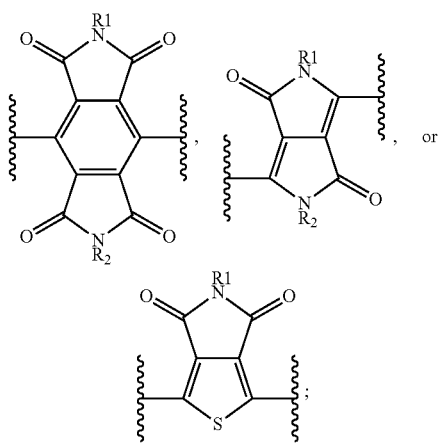

wherein R1 and R2 comprise independently straight or branched alkyl chains. In some embodiments, $\gamma_n$-X-$\gamma_n$ has one of the following structure:

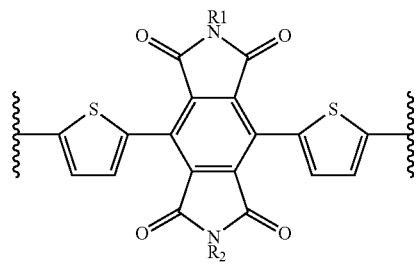

(benzene diimide; BDI),

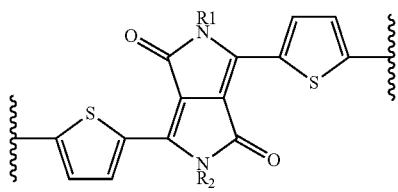

(diketopyrrolopyrrole; DPP), or

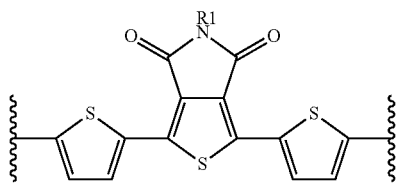

(thienopyrrole dione; TPD). In some embodiments, $\gamma_n$-X-$\gamma_n$ has the structure of BDI, DPP or TPD but with one or more, or all, of the thiophenes replaced with furans. In some embodiments, the $\gamma_n$ at both ends of X are identical. In some embodiments, the $\gamma_n$ at both ends of X comprise of one or more thiophenes. In some embodiments, the $\gamma_n$ at both ends of X comprise of one or more furans. In some embodiments, the $\gamma_n$ at both ends of X consist of only thiophene(s). In some embodiments, the $\gamma_n$ at both ends of X consist of only furan(s).

In some embodiments, R1 and R2 independently have at least about 4, 5, 6, or 8 carbon atoms. In some embodiments, R1 and R2 independently have from about 4 to 40 carbon atoms. In some embodiments, R1 and R2 independently have from about 8 to 20 carbon atoms. In some embodiments, R1 and R2 independently comprise at least 1 or 2 branch chains comprising from about 1 to 16 carbon atoms. In some embodiments, R1 and R2 independently comprise at least 1 or 2 branch chains comprising from about 2 to 8 carbon atoms. In some embodiments, R1 and R2 independently comprise a main chain of from 3 to 24 carbon atoms and a branch chain having 1 to 16 atoms. In some embodiments, R1 and R2 independently comprise a main chain of from 3 to 24 carbon atoms and a branch chain having 2 to 8 atoms. In some embodiments, R1 and R2 independently comprise a main chain of from 6 to 12 carbon atoms and a branch chain having 2 to 8 atoms. In some embodiments, R1 and R2 independently comprise a branch chain attached to C2 of a main chain. In some embodiments, R1 and R2 independently comprise a branch chain having 1, 2, 3, or 4 carbon atoms less than a main chain. In some embodiments, R1 and R2 independently comprise a branch chain attached to C2 of a main chain, and the branch chain has 4 carbon atoms less than the main chain. In some embodiments, R1 and R2 independently are 2-ethylhexyl, 2-butyloctyl, 2-hexylddecyl, or 2-octyldodecyl. In some embodiments, R1 and R2 are identical.

In some embodiments, α and β independently have at least one line of symmetry, or a 2-fold, or 3-fold, or more, rotational symmetry. In some embodiments, α and β independently comprise at least two, three or four ring structures. In some embodiments, α and β independently comprise a benzene or a thiophene. In some embodiments, α and β independently comprise from about one to eight benzenes. In some embodiments, α and β independently comprise from about one to four benzenes. In some embodiments, α and β independently comprise one or more heteroatoms, such as sulfur, selenium, oxygen, nitrogen, boron, or the like, and/or one or more other substituents. In some embodiments, α and β independently comprise a polycyclic aromatic (or partially aromatic) hydrocarbon (PAH), such as, acenaphthene, acenaphthylene, anthanthrene, anthracene, benz[a]anthracene, benzo[a]pyrene, benzo[e]pyrene, benzo[b]fluoranthene, benzo[ghi]perylene, benzoMfluoranthene, benzo[k]fluoranthene, benzopyrene, chrysene, coronene, corannulene, dibenz(a,h)anthracene, fluoranthene, fluorine, hexabenzocoronene, indeno(1,2,3-cd)pyrene, naphthalene, ovalene, pentacene, pentaphene, perylene, phenanthrene, pyrene, tetracene, tetraphene, and triphenylene. In some embodiments, α and β independently comprise a derivative of a polycyclic aromatic (or partially aromatic) hydrocarbon (PAH), comprising one or more heteroatoms (such as, sulfur, selenium, oxygen, nitrogen, boron, or the like) or substituents. In some embodiments, α and β are independently

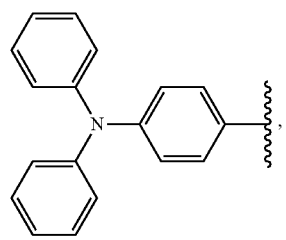

-continued

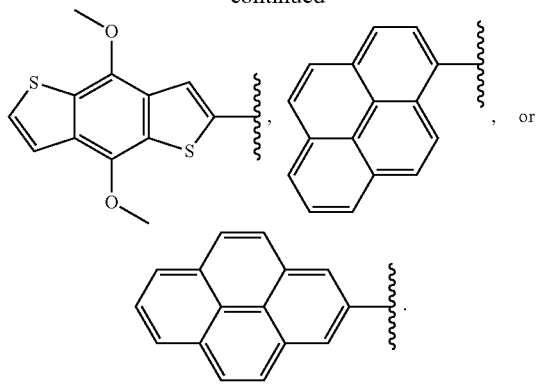

Figure 9:
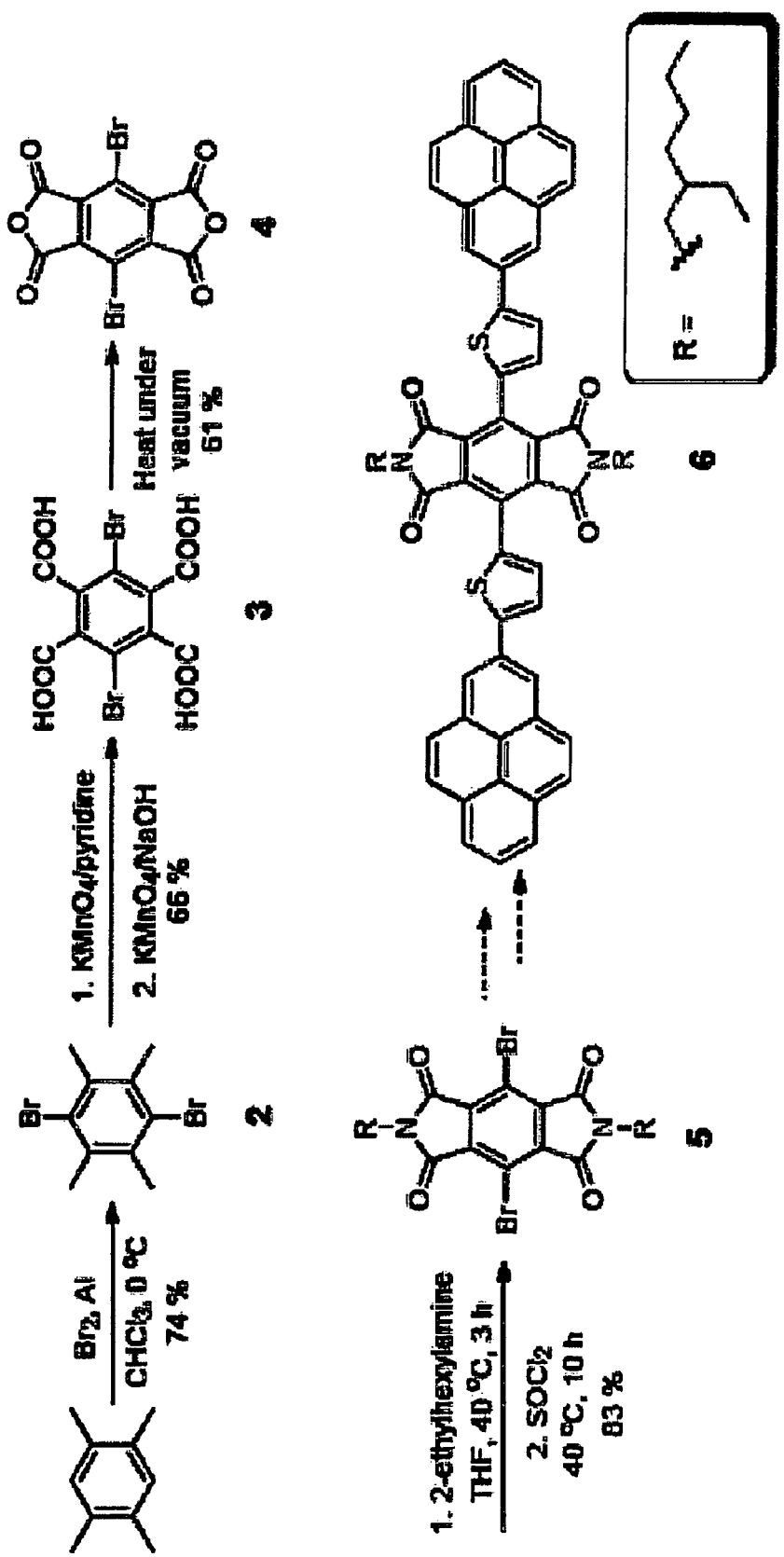
FIG. 9 shows a scheme for the synthesis of BDI.
Figure 10:
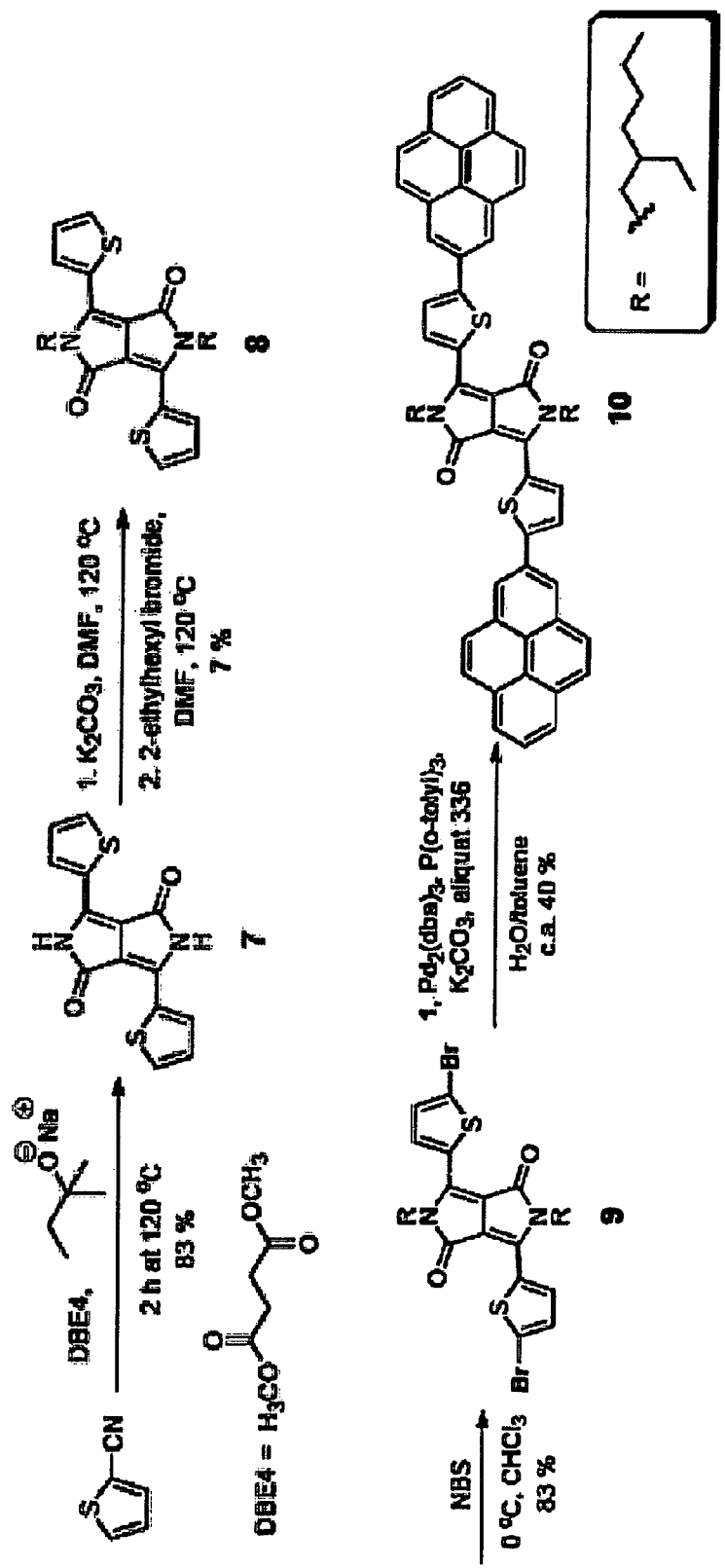
FIG. 10 shows a scheme for the synthesis of DPP.
Figure 11:
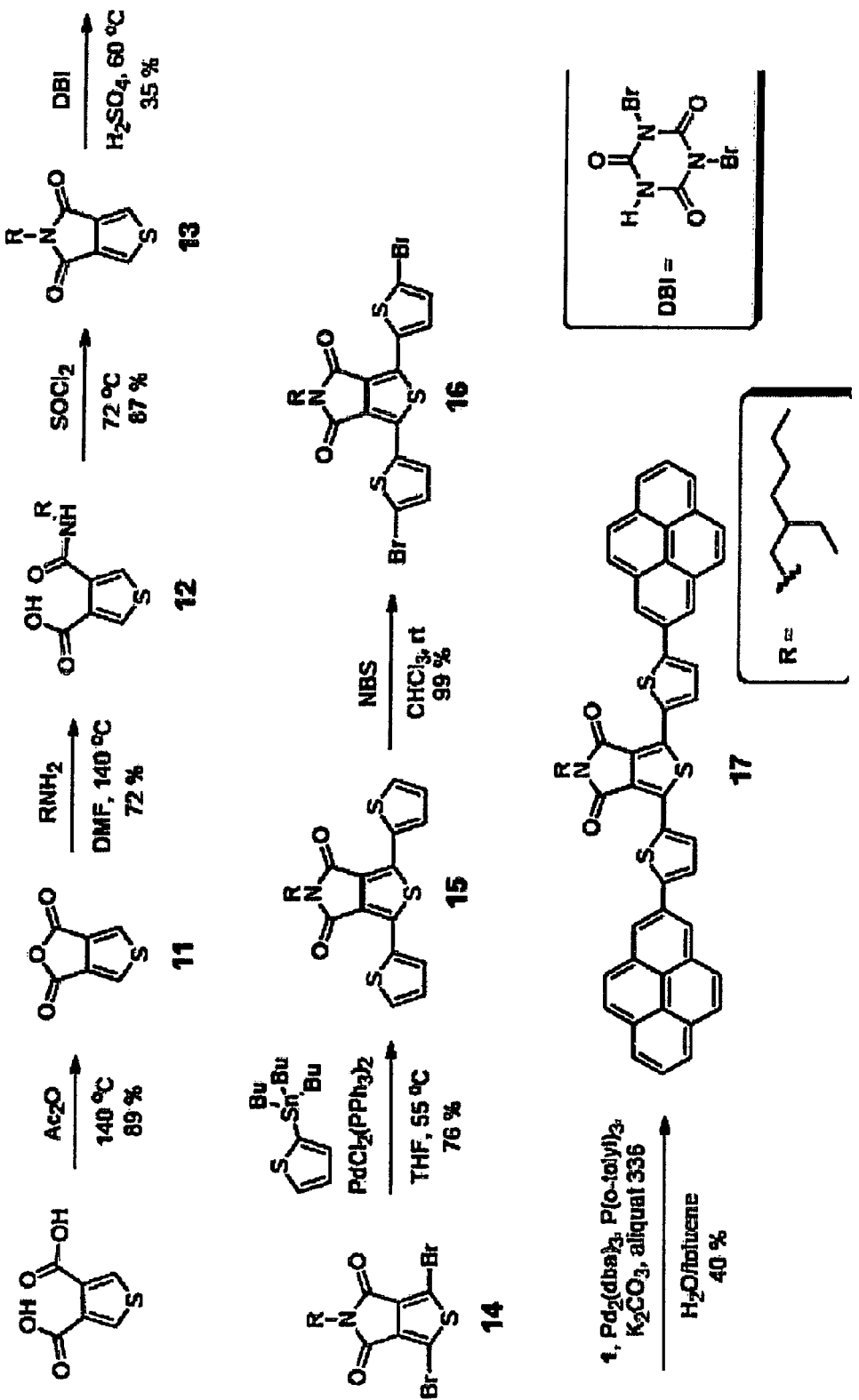
FIG. 11 shows a scheme for the synthesis of TPD.
Figure 12:
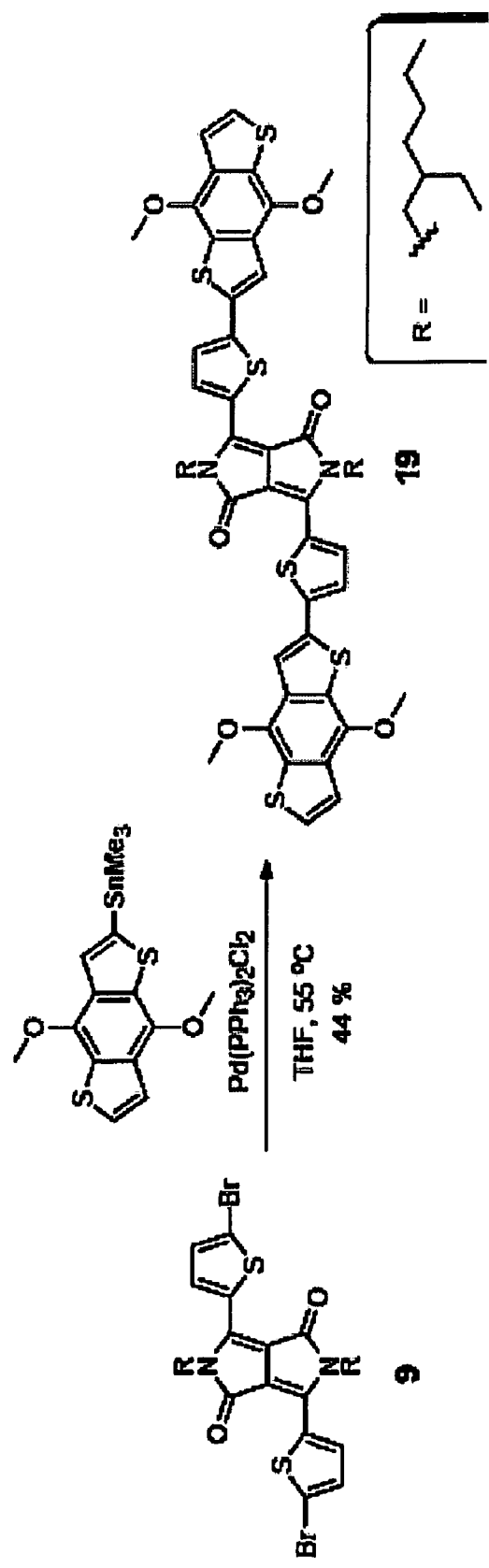
FIG. 12 shows a scheme for the synthesis of DPP-BDT.
Figure 13:
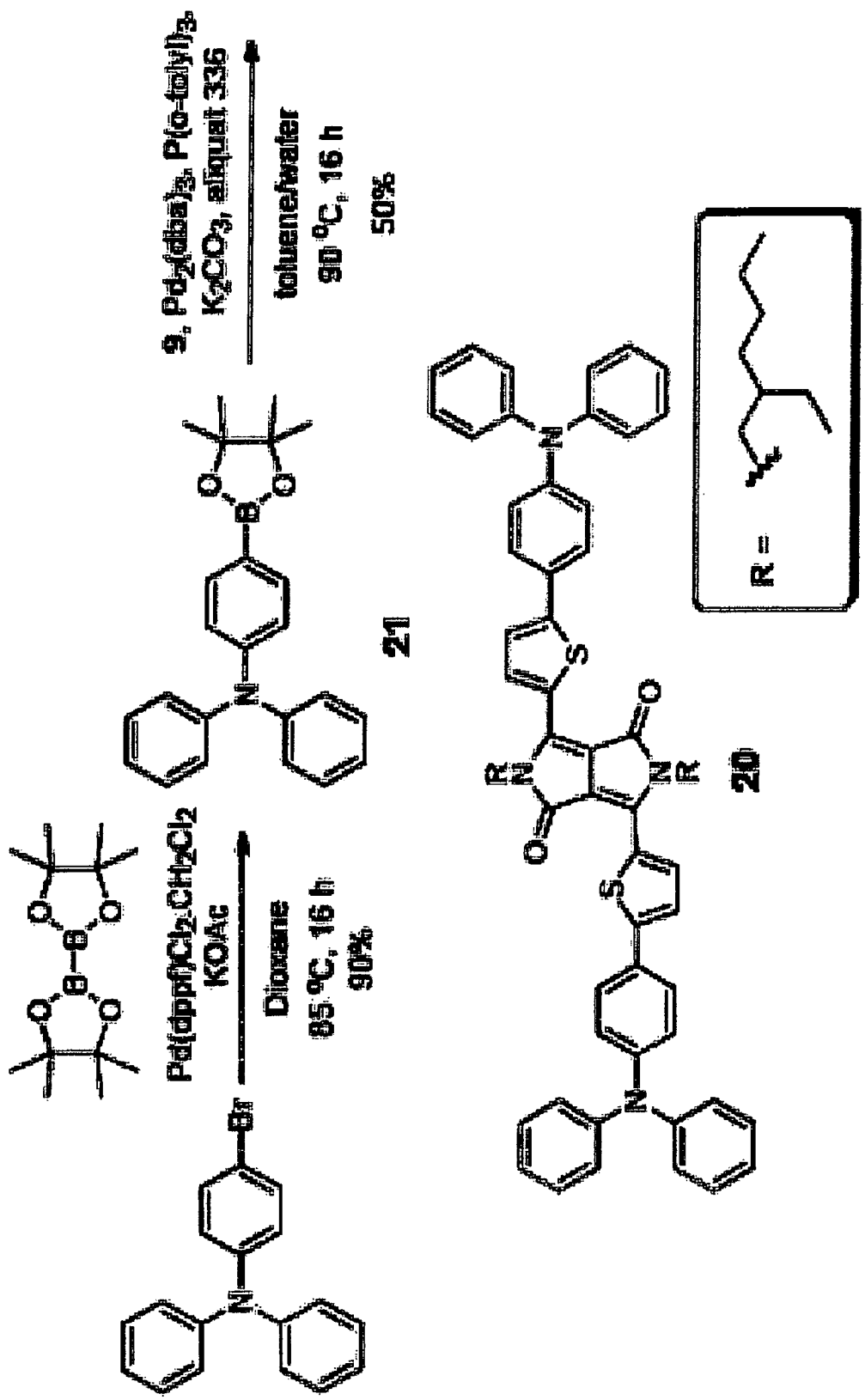
FIG. 13 shows a scheme for the synthesis of DPP-TPA.

The organic compounds of the present invention have one of more of the following advantages: monodisperse, having simple purification, and straightforward characterization. The organic compounds of the present invention can be synthesized in the following exemplary methods:

BDI can be synthesized by the scheme shown in FIG. 9.
DPP can be synthesized by the scheme shown in FIG. 10.
TPD can be synthesized by the scheme shown in FIG. 11.
DPP-BDT can be synthesized by the scheme shown in FIG. 12.
DPP-TPA can be synthesized by the scheme shown in FIG. 13.

Figure 6:
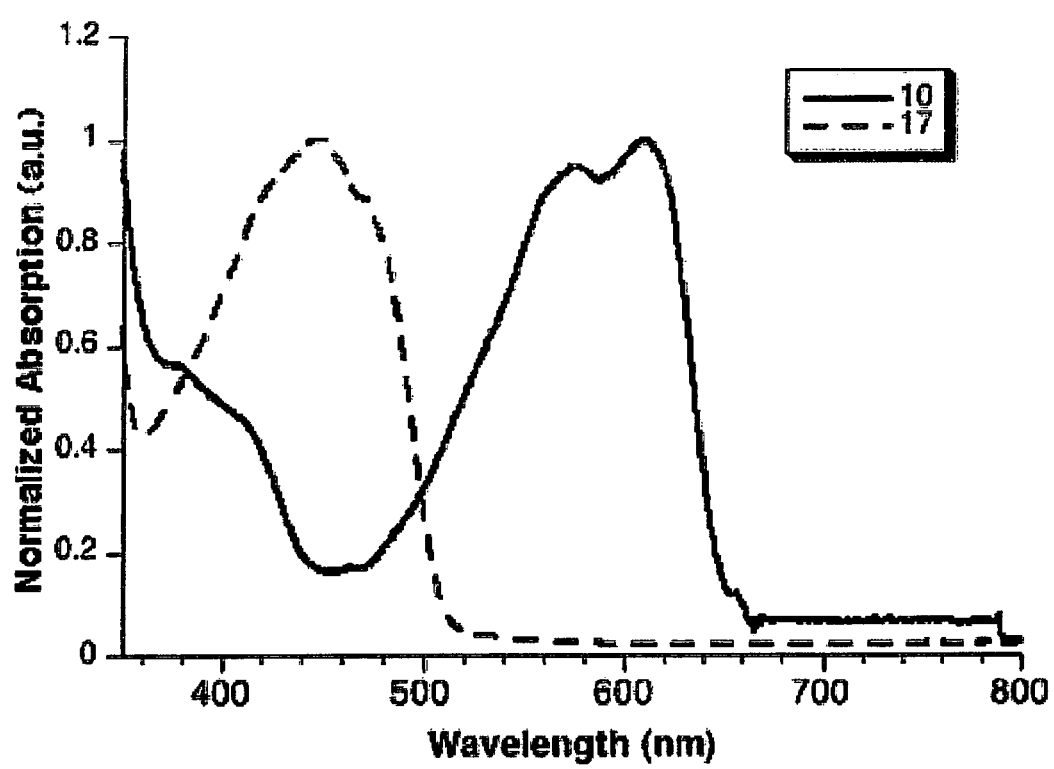
FIG. 6 shows the UV-VIS spectra of compounds 10 and 17 in chloroform.

FIG. 6 shows the UV-VIS spectra of compounds 10 and 17 in chloroform. Opticalbands correspond to 1.9 eV (compound 10) and 2.4 eV (compound 17). The modulation of the electron-deficient unit can significantly influence electronic properties.

Figure 7:
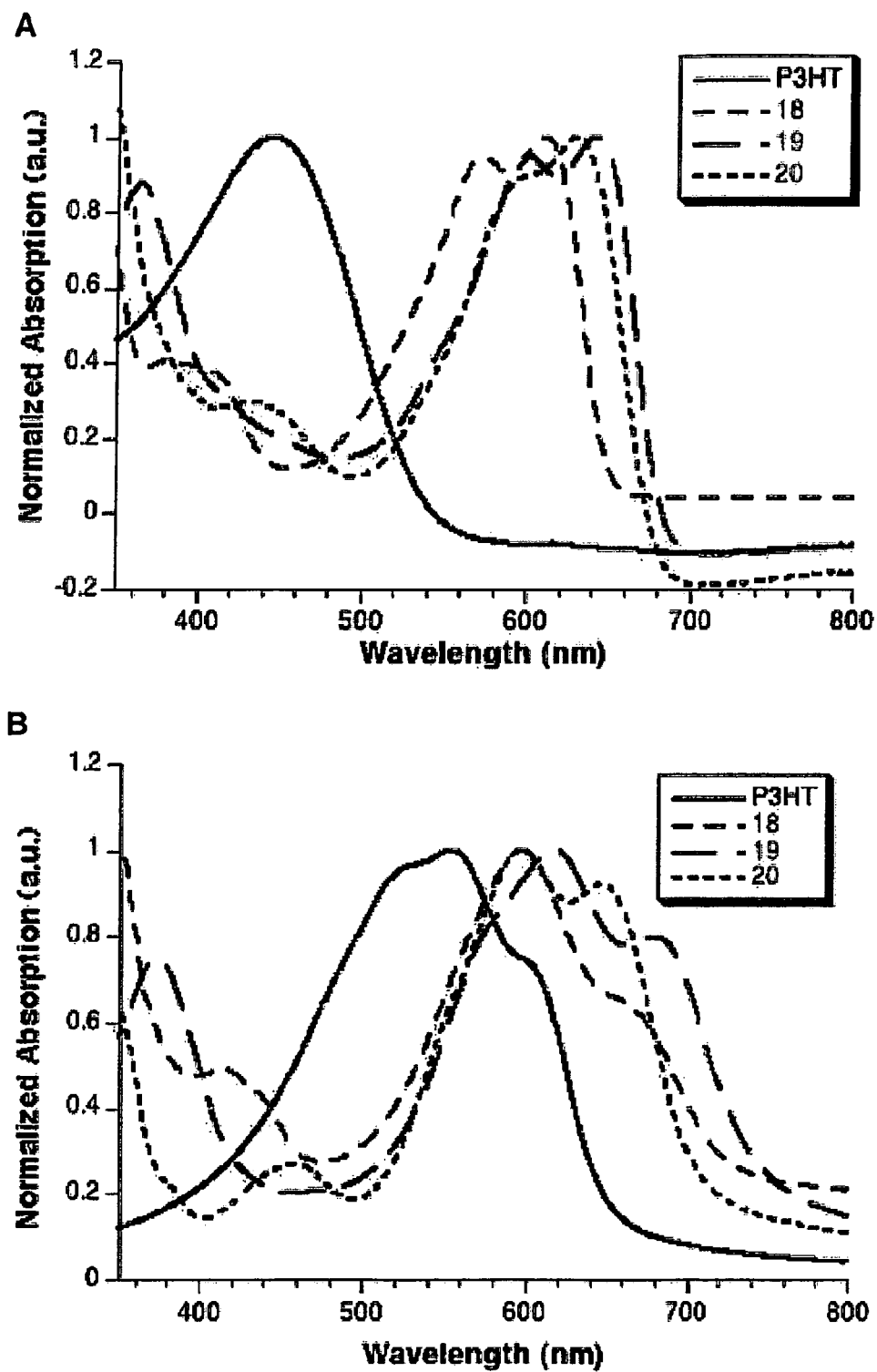
FIG. 7 shows the UV-VIS characterization of compounds 18-20 in (A) solution and (B) thin films.

FIG. 7 shows the UV-VIS characterization of compounds 18-20 in solution and thin films. Table 2 shows extinction coefficient at $\lambda_{max}$ in solution and solid state.

TABLE 2

| | Solution | | Thin-film | |
|---|---|---|---|---|
| Compound | $\lambda_{max}$ | $\epsilon(M^{-1} cm^{-1})$ | $\lambda_{max}$ | $\alpha(cm^{-1})$ |
| P3HT | — | — | 560 | $1.0 \times 10^5$ |
| DPP(TBFu)$_2$[a] | 630 | $6.4 \times 10^4$ | — | — |
| 18 | 610 | $6.0 \times 10^4$ | 597 | $6.3 \times 10^4$ |
| 19 | 641 | $2.5 \times 10^5$ | 617 | $6.4 \times 10^4$ |
| 20 | 630 | $1.6 \times 10^5$ | 599 | $5.9 \times 10^4$ |

[a]*Adv. Func. Mater.* 2009, 19, 3063-3069.

Figure 8:
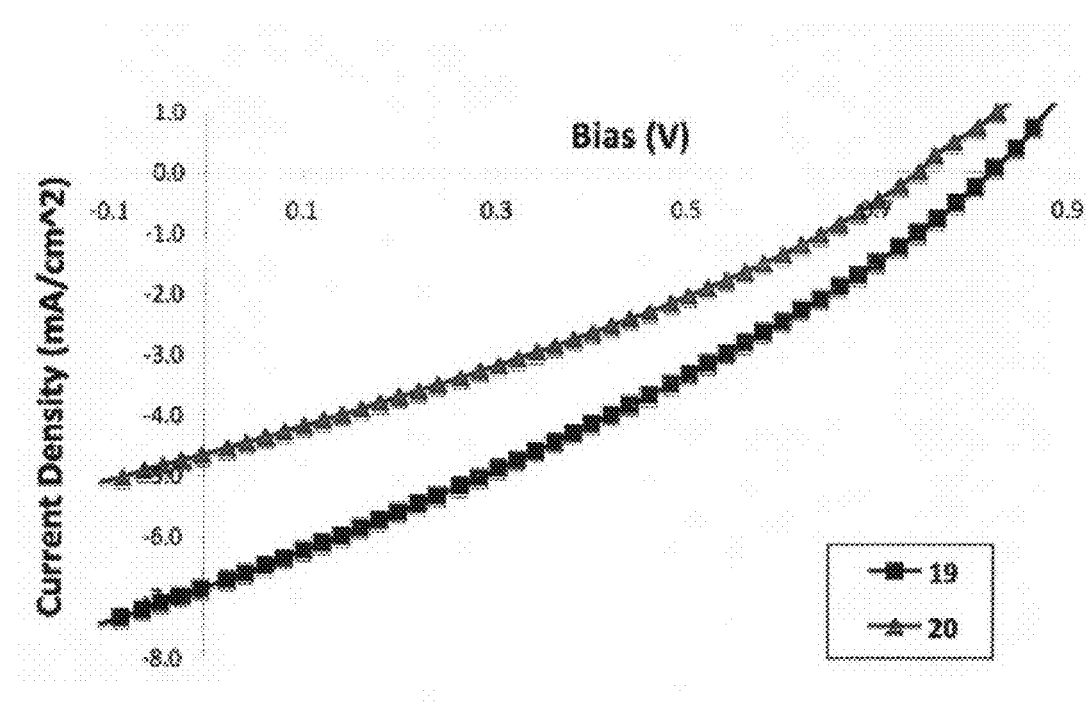
FIG. 8 shows the PV device performance of compounds 19 and 20.

FIG. 8 shows the PV device performance of compounds 19 and 20. Table 3 shows the Voc, Jsc and FF of compounds 19 and 20.

TABLE 3

| Compound | Solvent | Blend ratio (donor:PC$_{71}$BM) | $V_{oc}$ (V) | $J_{sc}$ (mA) | FF | η(%) |
|---|---|---|---|---|---|---|
| 19 | 2:1 CB:DCB | 1:4 | 0.82 | −6.86 | 0.30 | 1.7 |
| 20 | Chloroform | 1:4 | 0.75 | −4.61 | 0.31 | 1.1 |

It is to be understood that, while the invention has been described in conjunction with the preferred specific embodiments thereof, the foregoing description is intended to illustrate and not limit the scope of the invention. Other aspects, advantages, and modifications within the scope of the invention will be apparent to those skilled in the art to which the invention pertains.

All patents, patent applications, and publications mentioned herein are hereby incorporated by reference in their entireties.

The invention having been described, the following examples are offered to illustrate the subject invention by way of illustration, not by way of limitation.

Example 1

Efficient Small Molecule Bulk Heterojunction Solar Cells with High Fill Factors Via Pyrene-Directed Self-Assembly Organic photovoltaics (OPVs) are a promising technology for cost-effective and scalable production of renewable energy.[1] Current research in OPV materials focuses primarily on the design and synthesis of semiconducting polymers capable of both light absorption and charge transport. In OPV cells utilizing a bulk heterojunction (BHJ) architecture, conjugated polymers have demonstrated promising device efficiency; however, they can suffer from drawbacks such as batch-to-batch variation and chain-end contamination, which can reduce overall performance and device consistency.[2a,3]

In order to develop OPV materials that exhibit not only favorable electronic properties but also batch-to-batch consistency, electroactive small molecules have recently received attention as alternatives to polymers.[2] Small molecules can be synthesized and solution-processed into devices on a large scale like polymers. Additionally, their monodispersity eliminates device variability from material inhomogeneity and offers comparatively straightforward synthesis, purification, and characterization. Despite these potential advantages, current small molecules exhibit photovoltaic efficiencies below those of the highest-performing polymers.[3,4]

The relatively low performance of small molecules may be attributed to their limited interconnectivity through the active layer, resulting in low device fill factors. It has been demonstrated that, in BHJ solar cells, polymers with higher molecular weight ($M_n$) perform better than those with lower $M_n$.[5,6] In low $M_n$ polymers, charge transport is limited by the short chain length.[5a] By extension, as small molecules represent the lower limit of $M_n$, their device performance can suffer from inadequate interconnectivity and inefficient charge extraction. Herein, we demonstrate that the interconnectivity of small molecule semiconductors can be greatly improved by directed molecular self-assembly. Small molecules designed with this principle are shown to generate highly ordered and interconnected domains exhibiting large fill factors and efficiencies in OPV devices.

We postulated that the introduction of π-stacking moieties onto the ends of small molecules would facilitate favorable end-to-end π-π interactions, leading to enhanced charge transport between adjacent molecules. To investigate this approach, a series of small molecules was synthesized, each with different electron-rich end-groups (FIG. 1). End-groups were selected for their varying degrees of planarity, which can affect their tendency to π-stack. Triphenylamine (TPA) has a non-planar structure with its phenyl groups twisting into a propeller motif.[7] Benzo[1,2-b; 4,5-b']dithiophene (BDT) contains a planar fused ring but has non-coplanar alkoxy substituents. Pyrene is a completely planar moiety and has a strong propensity to π-stack. In addition, the regio-connectivity between pyrene and the chromophoric core was varied to study the effect of end-group symmetry. As a platform for investigating the effect of these end-groups, diketopyrrolopyrrole (DPP) was chosen to be the electron-deficient core, since it has been used in molecules with promising optical properties, charge carrier mobility, and photovoltaic performance.[3,8]

Syntheses of the small molecules were achieved through Suzuki or Stille cross-coupling reactions to append the end-groups to the DPP core[3,9]. Notably, the C2-pyrene boronate ester was obtained by Ir(I)-catalyzed C—H functionalization for selective access to the C2 position.[10] All four molecules exhibit comparable absorption profiles (FIG. 1) and HOMO/LUMO energy levels (SI).

To determine the OPV performance of the small molecule materials, thin-film BHJ devices were prepared with the following architecture: ITO/PEDOT:PSS/small molecule: $PC_{71}BM$/Al. Upon extensive device optimization, small molecule 4a exhibits a notable maximum power conversion efficiency (PCE) of 2.7%, whereas 1, 2 and 3 exhibit lower device PCEs of 1.3%, 1.7% and 0.7%, respectively (Table 1, FIG. 2). While 1, 2 and 4a possess similar optoelectronic properties, their varying device performances suggest that PCE is highly dependent on end-group planarity. However, end-group planarity alone does not ensure high device efficiency, as demonstrated by the low PCE of 3. Changing the site of pyrene substitution from C1 (3) to C2 (4a) led to an enhancement of device performance, indicating that end-group symmetry can also have a dramatic influence on PCE. Further structural optimization of the C2-pyrene-based molecules was achieved by varying the N-alkyl solubilizing side-chains on the core moiety. Previous studies have shown that side-chains can affect crystallinity, intermolecular spacing, and OPV device performance.[11] To determine whether shorter alkyl chains could tighten molecular packing and improve OPV performance, the 2-octyldodecyl groups on 4a were replaced with 2-hexyldecyl (4b), 2-butyloctyl (4c), and 2-ethylhexyl (4d) groups. Molecule 4b exhibits the highest PCE (4.1% max.) in this series and has the one of the highest fill factors (0.58) for a solution-processed small molecule OPV system. Further decreasing the size of the alkyl groups resulted in limited solubility and processing challenges, giving 4c a lower device performance than 4b. Molecule 4d lacked sufficient solubility to be processed into a functional device.

TABLE 1

Average PV performance of 1-4 blended with $PC_{71}BM$ ($J_{sc}$ = short-circuit current density, $V_{oc}$ = open-circuit voltage, FF = fill factor).

| | Blend Ratio[a] | $J_{SC}$ [mA/cm$^2$] | $V_{OC}$ [V] | FF | PCE [%] | Max. PCE [%] |
|---|---|---|---|---|---|---|
| 1 | 1:4[b] | −4.3 | 0.73 | 0.31 | 1.0 | 1.3 |
| 2 | 1:4[c] | −6.2 | 0.81 | 0.30 | 1.3 | 1.7 |
| 3 | 1:4[b] | −3.2 | 0.73 | 0.29 | 0.7 | 0.7 |
| 4a | 2:1[b] | −5.7 | 0.77 | 0.55 | 2.4 | 2.7 |
| 4b | 2:1[b] | −8.3 | 0.76 | 0.58 | 3.7 | 4.1 |
| 4c | 2:1[d] | −6.6 | 0.78 | 0.48 | 2.4 | 3.0 |

[a]Mass ratio of small molecule donor to $PC_{71}BM$.
[b]Devices prepared from solution in chloroform.
[c, d]Devices prepared from solution in mixed solvent: chlorobenzene/1,2-dichlorobenzene ([c]66.7/33.3 v/v; [d]75/25 v/v).

Figure 2:
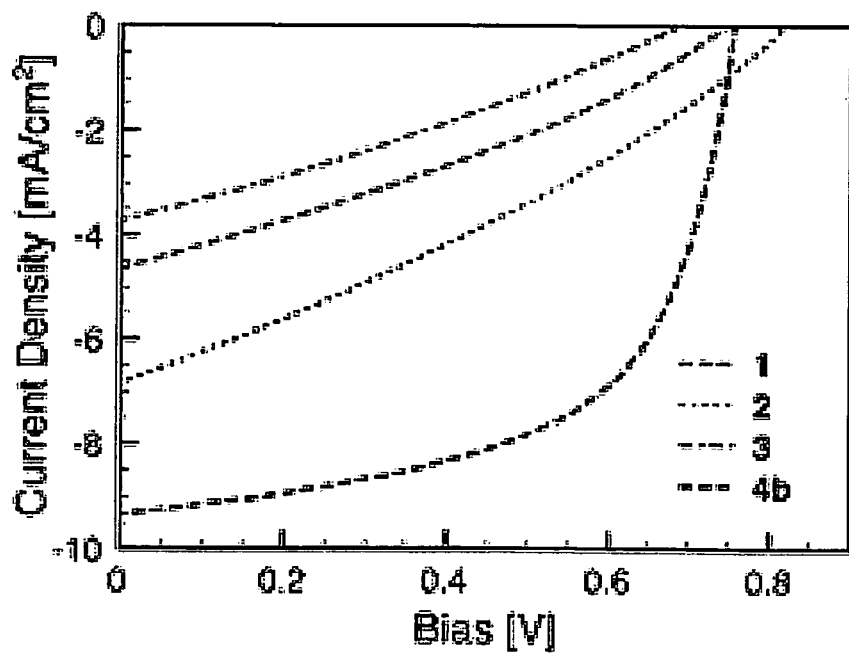
FIG. 2. Characteristic J-V curves of solar cells fabricated from 1, 2, 3 and 4b illuminated under AM 1.5 G, 100 mW/cm$^2$.

As shown in Table 1 and FIG. 2, the high device PCE of C2-pyrene-based molecules can be mainly attributed to their high fill factors (FFs). FF is known to depend largely on carrier mobility, charge recombination, current leakage, and balanced transport of holes and electrons through the device active layer.[1,12] Molecules 4a and 4b exhibit device FFs of 0.55 and 0.58, whereas molecules 1, 2 and 3 exhibit FFs of 0.29, 0.30 and 0.31, respectively. The high FFs are unique to 4a-4c, even at different donor:$PC_{71}BM$ ratios (FIG. 3B).

Figure 3:
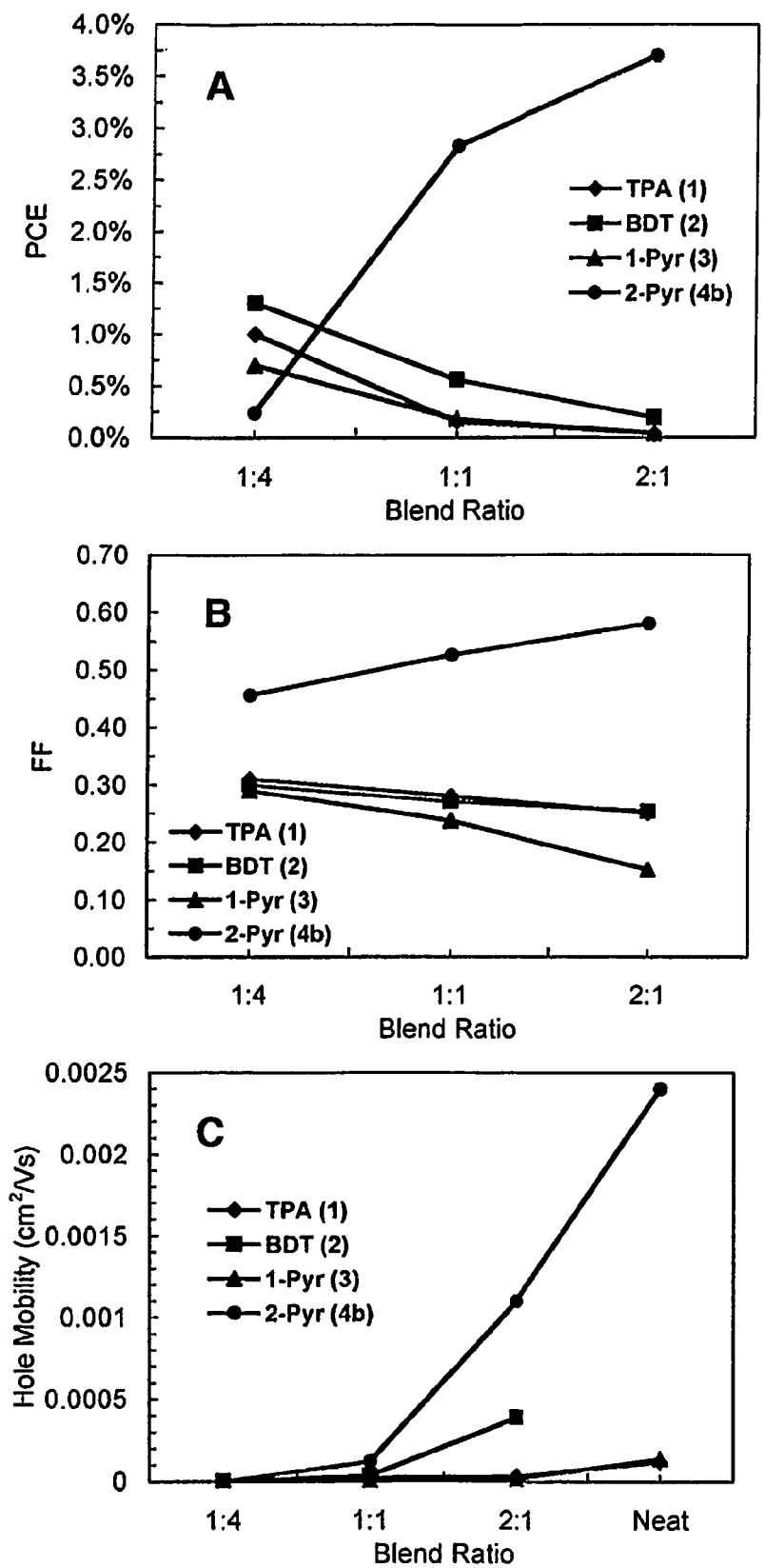
FIG. 3. The effect of different blend ratios (small molecule: PC$_{71}$BM) on (A) PCE, (B) FF, and (C) space-charge-limited current (SCLC) hole mobility of the devices fabricated from molecules 1, 2, 3 and 4b. As donor content increases, the FF and PCE are enhanced only in molecules with C2-pyrene end-groups.

Devices fabricated with 1, 2 and 3 were optimized at a 1:4 donor:$PC_{71}BM$ ratio; further increasing the donor content reduced device FF and PCE even though the hole mobility of these devices increased (FIG. 3). In contrast, for molecules containing C2-pyrene end-groups (4a-4c), increasing the donor content enhanced both FF and hole mobility, contributing to the high device efficiency at the optimized ratio of 2:1 donor:$PC_{71}BM$ ratio. These results suggest that, relative to the other end-groups studied, the C2-pyrene end-group affects intermolecular interactions which may promote molecular packing and active layer morphology favorable for high device PCE.

Figure 4:
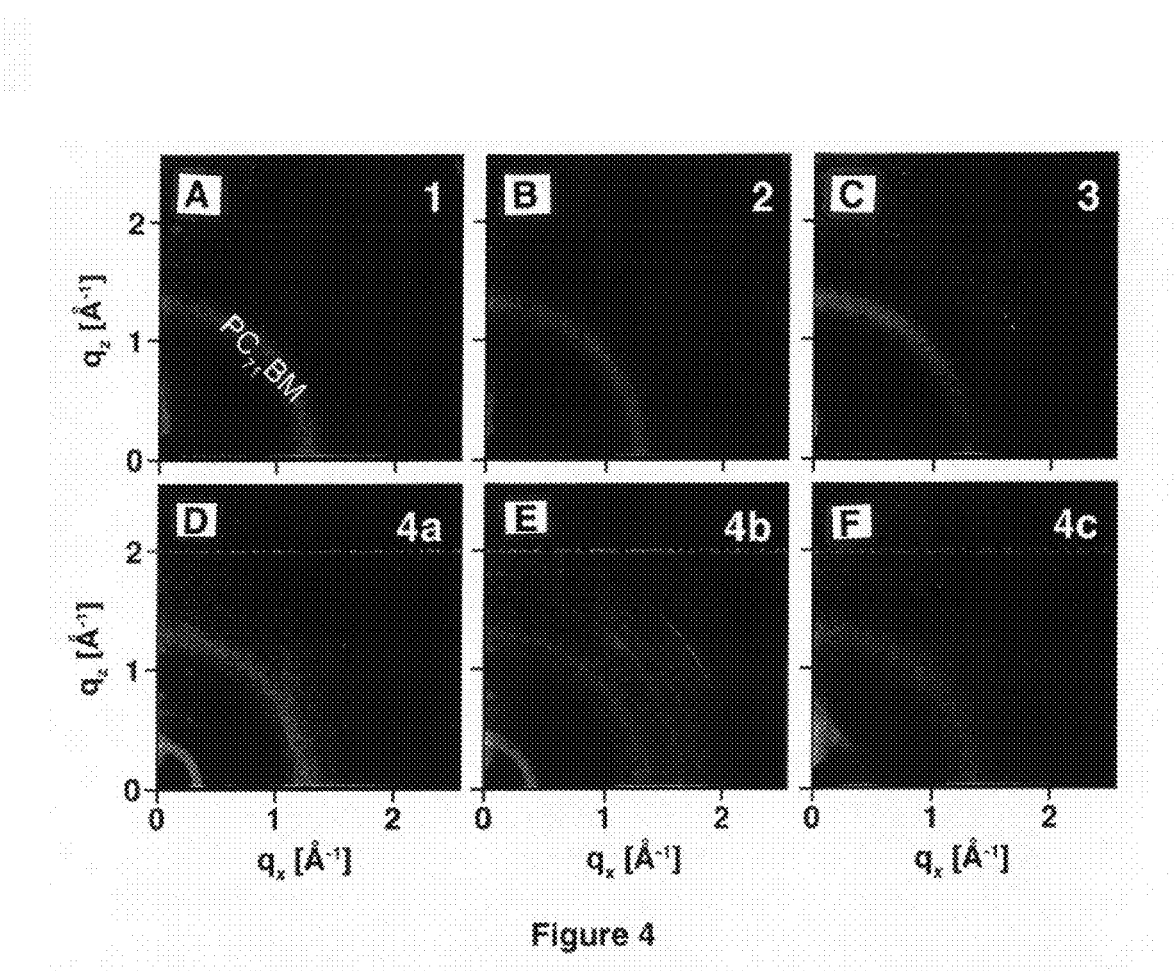
FIG. 4. 2-D GIXS patterns of thin films of 1, 2, 3, 4a, 4b, and 4c, respectively, blended with PC$_{71}$BM, prepared under the same conditions as for optimized device fabrication.
Figure 5:
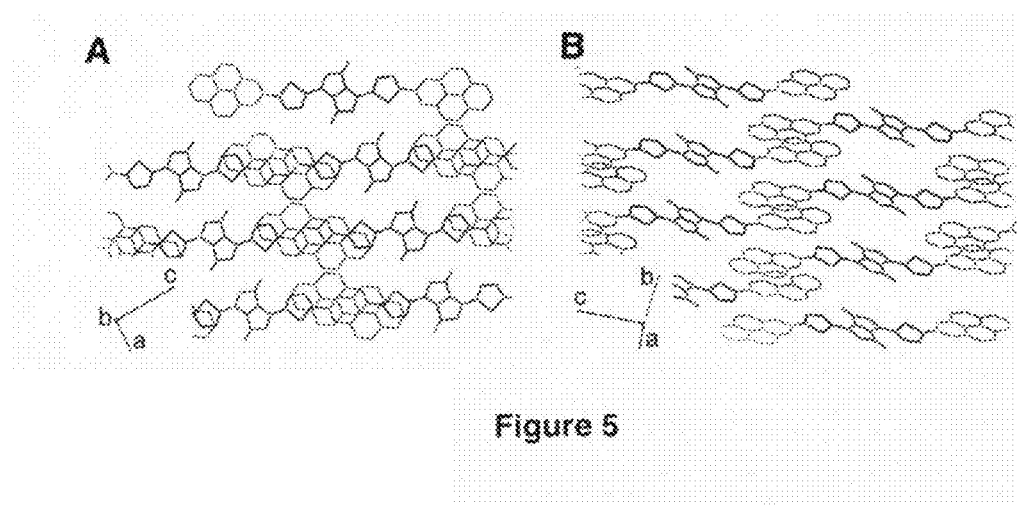
FIG. 5. (A) View down the b-axis and (B) angle view of the single crystal structure of 4a, as determined by X-ray crystallography. Alkyl side chains are omitted for clarity. The pyrene-pyrene interplanar distance is ~3.50 Å, confirming close π-π stacking between pyrene moieties.

To understand how the C2-pyrene end-group can promote molecular assembly, the nanoscale film morphology and solid-state packing of DPP-C2-pyrene were investigated by atomic force microscopy (AFM) and X-ray diffraction. By AFM characterization, the active layers of the thin-film devices fabricated from 1 and 3 appear smooth and relatively amorphous, while the device active layer of 2 exhibits domains approaching the 1-μm length scale. In contrast, the device active layers of 4a and 4b display a network of highly-crystalline features sized ~10-30 nm (SI). Grazing-incidence X-ray scattering (GIXS) pattern of a thin-film BHJ of 4b and $PC_{71}BM$ shows sharply defined rings and peaks, suggesting that the packing of 4b is both more crystalline and more aligned than that of 1, 2, and 3, whose scattering patterns indicate relatively amorphous films (FIG. 4). Single crystal X-ray analysis of 4a shows a closely-packed, interdigitated crystal structure with extensive overlap of C2-pyrene moieties (FIG. 5). The interplanar distance between two pyrene units is 3.50 Å, confirming strong face-to-face π-π interaction between molecules. With this packing configuration, charges can move both parallel (c direction) and perpendicular (b direction) to the long-axis of the molecule, which is in good agreement with the high hole mobilities measured for 4b.

In summary, we demonstrate that efficient OPV materials can be constructed by the attachment of completely planar, symmetric end-groups to electroactive small molecules. Appending C2-pyrene as the small molecule end-group results in materials with tight, aligned crystal packing and favorable morphology dictated by π-π interactions. The intermolecular connectivity promoted by C2-pyrene allows devices containing blends of 4b and $PC_{71}BM$ to reach a maximum PCE above 4% with a FF approaching 0.6. This device FF is one of the highest values reported to date in high-performing small molecule BHJ OPVs. The use of end-groups to direct molecular self-assembly represents an effective strategy for designing high-performance small molecule OPV devices.

REFERENCES a) A. W. Hains; Z. Liang; M. A. Woodhouse; B. A. Gregg. *Chem. Rev.* 2010, 110, 6689-6735. b) A. C. Arias; J. D. MacKenzie; I. McCulloch; J. Rivnay; A. Salleo. *Chem. Rev.* 2010, 110, 3-24. c) B. C. Thompson; J. M. J. Fréchet. *Angew. Chem. Int. Ed.* 2008, 47, 58-77.

a) J. Roncali. *Acc. Chem. Res.* 2009, 42, 1719-1730. b) H. Bürckstümmer; N. M. Kronenberg; M. Gsänger; M. Stolte; K. Meerholz. *J. Mater. Chem.* 2010, 20, 240-243. c) B. Walker; C. Kim; T.-Q.Nguyen. *Chem. Mater.* 2011, 23, 470-482. d) R. Y. C. Shin; P. Sonar; P. S. Siew; Z.-K. Chen; A. Sellinger. *J. Org. Chem.* 2009, 74, 3293-3298. e) L. C. Palilis; P. A. Lane; G. P. Kushto; B. Purushothaman; J. E. Anthony; Z. H. Kafafi. *Org. Electron.* 2008, 9, 747-752.

B. Walker; A. B. Tamayo; X.-D. Dang; P. Zalar; J. H. Seo; A. Garcia; M. Tantiwiwat.; T.-Q. Nguyen. *Adv. Funct. Mater.* 2009, 19, 3063-3069.

a) Y. Liang; L. Yu. *Acc. Chem. Res.* 2010, 43, 1227-1236. b) Y. Liang; Z. Xu; J. Xia; S. Tsai; Y. Wu; G. Li; C. Ray; L. Yu. *Adv. Mater.* 2010, 22, E135-E138.

a) R. J. Kline; M. D. McGehee; E. N. Kadnikova; J. Liu; J. M. J. Fréchet; M. F. Toney. *Macromolecules,* 2005, 38, 3312-3319. b) A. Zen; J. Pflaum; S. Hirschmann; W. Zhuang; F. Jaiser; U. Asawapirom; J. P. Rabe; U. Scherf; D. Neher. *Adv. Funct. Mater.* 2004, 14, 757-564.b a) M. Tong; S. Cho; J. T. Rogers; K. Schmidt; B. B. Y. Hsu; D. Moses; R. C. Coffin; E. J. Kramer; G. C. Bazan; A. J. Heeger. *Adv. Funct. Meter.* 2010, 20, 3959-3965. b) C. Müller; E. Wang; L. M. Andersson; K. Tvingstedt; Y. Zhou; M. R. Andersson; O. Inganäs. *Adv. Funt. Mater.* 2010, 20, 2124-2131.

W. Tang; J. Hai; Y. Dai; Z. Huang; B. Lu; F. Yuan; J. Tang; F. Zhang. *Sol. Energ. Mat. Sol. C* 2010, 94, 1963-1979.

a) M. M. Wink; M. Turbiez; J. Gilot; R. A. J. Janssen. *Adv. Mater.* 2008, 20, 2556-2560. b) J. C. Bijleveld; A. P. Zoombelt; S. G. J. Mathijssen; M. M. Wienk; M. Turbiez; D. M. de Leeuw; R. A. J. Janssen. *J. Am. Chem. Soc.* 2009, 131, 16616-16617. c) A. B. Tamayo; X.-D. Dang; B. Walker; J. Seo; T. Kent; T.-Q. Nguyen. *Appl. Phys. Lett.* 2009, 94, 103301. d) P. Sonar; S. Singh; Y. Li; M. Soh; A. Dodabalapur. *Adv. Mater.* 2010, 22, 5409-5413. e) S. Loser; C. J. Bruns; H. Miyauchi; R. P. Ortiz; A. Facchetti; S. I. Stupp; T. J. Marks. *J. Am. Chem. Soc.* 2011, 133, DOI: 10.1021/ja202791n.

C. J. H. Morton; R. L. Riggs; D. M. Smith; N. J. Westwood; P. Lightfoot; A. M. E. Slawin. *Tetrahedron* 2005, 61, 727-738.

a) I. Mkhalid; J. Barnard; T. Marder; J. Murphy; J. Hartwig. *Chem. Rev.* 2009, 110, 890-931. b) D. N. Coventry; A. S. Batsanov; A. E. Goeta; J. A. K. Howard; T. B. Marder; R. N. Perutz. *Chem. Commun.* 2005, 2172.

a) C. Piliego; T. W. Holcombe; J. D. Douglas; C. H. Woo; P. M. Beaujuge; J. M. J. Frechet. *J. Am. Chem. Soc.* 2010, 132, 7595-7597. b) J. M. Szarko; J. Guo; Y. Liang; B. Lee; B. S. Rolczynski; J. Strzalka; T. Xu; S. Loser; T. J. Marks; L. Yu; L. X. Chen. *Adv. Mater.* 2010, 22, 5468-5472.

a) M. Kim; B. Kim; J. Kim. *ACS Appl. Mater. Interfaces* 2009, 1, 1264-1269. b) H. Kagayama; H. Ohishi; M. Tanaka; Y. Ohmori; Y. Shirota. *Adv. Funct. Mater.* 2009, 19, 3948-3955. c) W. W. H. Wong; T. B. Singh; D. Vak; W. Pisula; C. Yan; X. Feng; E. L. Williams; K. L. Chan; Q. Mao; D. J. Jones; C. Ma; K. Müllen; P. Bäuerle; A. B. Holmes. *Adv. Funct. Mater.* 2010, 20, 927-938. d) J. Wagner; M. Gruber; A. Hinderhofer; A. Wilke; B. Bröker; J. Frisch; P. Amsalem; A. Vollmer; A. Opitz; N. Koch; F. Schreiber; W. Brütting. *Adv. Funct. Mater.* 2010, 20, 4295-4303.

Assuring interconnectivity through the active layer is a prerequisite for the use of small molecules in solution-processed organic photovoltaic (OPV) devices. Small molecule donors containing C2-substituted pyrene end-groups exhibit a fill factor of 0.58 and an efficiency of 4.1% in devices. We attribute this high performance to tight face-to-face packing mediated by the strong intermolecular π-π interactions of pyrene, enhancing molecular interconnectivity charge transport properties.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. An organic compound comprising the following structure: $\alpha$-$\gamma_n$-X-$\gamma_n$-$\alpha$; wherein X consists of

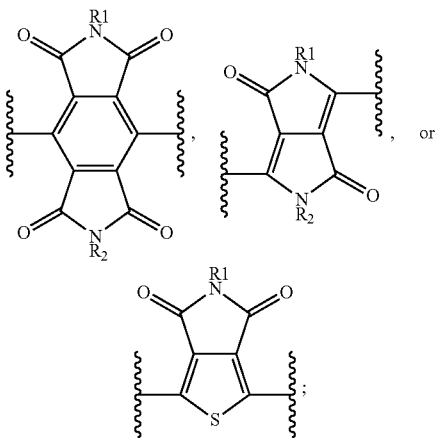

wherein R1 and R2 each independently comprise a straight or branched alkyl chain; each γ is independently a thiophene, furan, or pyrrole; each n is independently an integer from 1 to 20; and, each α comprises a multi-ring aromatic structure which are each capable of π-stacking with the α of a second organic compound, wherein the organic compound and second organic compound can have identical or different chemical structures; wherein (a) the $\gamma_n$ at both ends of X comprise of one or more furans, (b) α has at least one line of symmetry, or at least a 2-fold rotational symmetry, or (c) α comprises an acenaphthene, acenaphthylene, anthanthrene, anthracene, benz[a]anthracene, benzo[a]pyrene, benzo[e]pyrene, benzo[b]fluoranthene, benzo[ghi]perylene, benzo[j]fluoranthene, benzo[k]fluoranthene, benzopyrene, chrysene, coronene, corannulene, dibenz(a,h)anthracene, fluoranthene, hexabenzocoronene, indeno(1,2,3-cd)pyrene, naphthalene, ovalene, pentacene, pentaphene, perylene, phenanthrene, pyrene, tetracene, tetraphene, triphenylene,

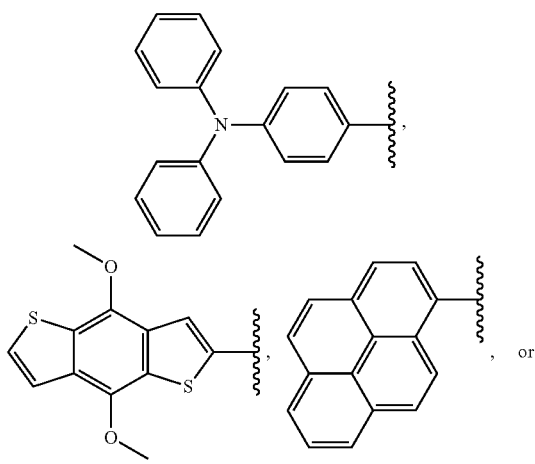

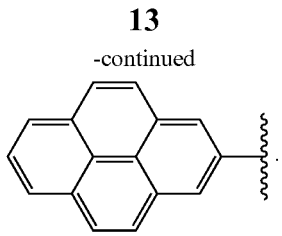

2. The organic compound of claim 1, wherein (a) α has at least one line of symmetry, or at least a 2-fold rotational symmetry, or (b) α comprises an acenaphthene, acenaphthylene, anthanthrene, anthracene, benz[a]anthracene, benzo[a]pyrene, benzo[e]pyrene, benzo[b]fluoranthene, benzo[ghi]perylene, benzo[j]fluoranthene, benzo[k]fluoranthene, benzopyrene, chrysene, coronene, corannulene, dibenz(a,h)anthracene, fluoranthene, hexabenzocoronene, indeno(1,2,3-cd)pyrene, naphthalene, ovalene, pentacene, pentaphene, perylene, phenanthrene, pyrene, tetracene, tetraphene, triphenylene,

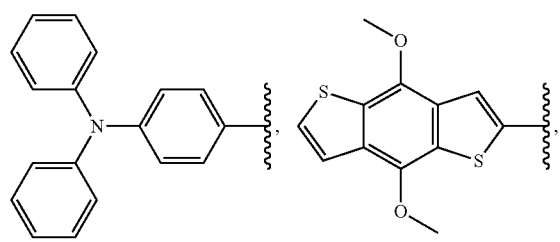

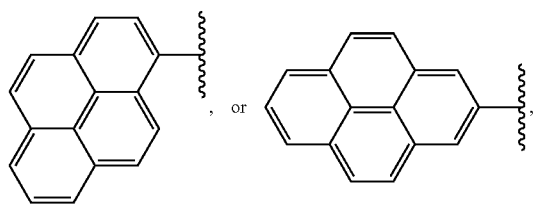

and each γ is independently

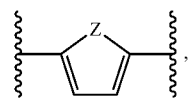

wherein Z is —S—, —O—, or —NH—.

3. The organic compound of claim 1, wherein (a) α has at least one line of symmetry, or at least a 2-fold rotational symmetry, or (b) α comprises an acenaphthene, acenaphthylene, anthanthrene, anthracene, benz[a]anthracene, benzo[a]pyrene, benzo[e]pyrene, benzo[b]fluoranthene, benzo[ghi]perylene, benzo[j]fluoranthene, benzo[k]fluoranthene, benzopyrene, chrysene, coronene, corannulene, dibenz(a,h)anthracene, fluoranthene, hexabenzocoronene, indeno(1,2,3-cd)pyrene, naphthalene, ovalene, pentacene, pentaphene, perylene, phenanthrene, pyrene, tetracene, tetraphene, triphenylene,

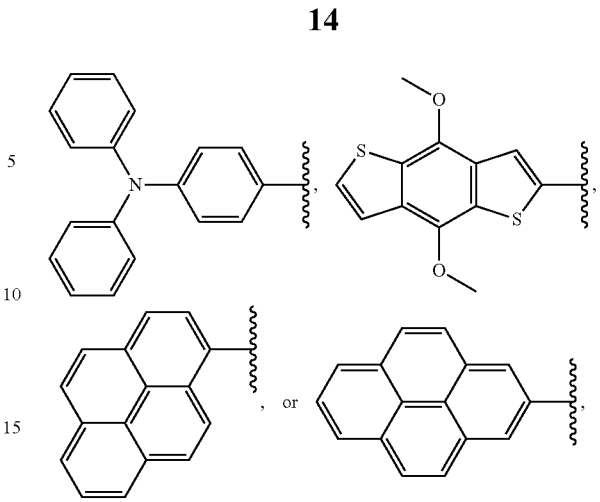

and $\gamma_n$-X-$\gamma_n$ has one of the following structure:

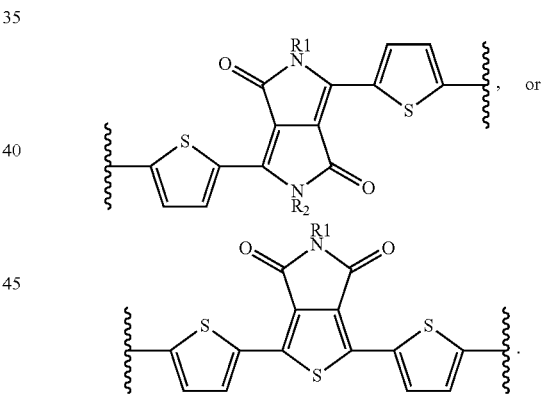

4. The organic compound of claim 1, wherein the $\gamma_n$ at both ends of X are identical.

5. The organic compound of claim 1, wherein the $\gamma_n$ at both ends of X comprise of one or more thiophenes.

6. The organic compound of claim 5, wherein (a) α has at least one line of symmetry, or at least a 2-fold rotational symmetry, or (b) α comprises an acenaphthene, acenaphthylene, anthanthrene, anthracene, benz[a]anthracene, benzo[a]pyrene, benzo[e]pyrene, benzo[b]fluoranthene, benzo[ghi]perylene, benzo[j]fluoranthene, benzo[k]fluoranthene, benzopyrene, chrysene, coronene, corannulene, dibenz(a,h)anthracene, fluoranthene, hexabenzocoronene, indeno(1,2,3-cd)pyrene, naphthalene, ovalene, pentacene, pentaphene, perylene, phenanthrene, pyrene, tetracene, tetraphene, triphenylene,

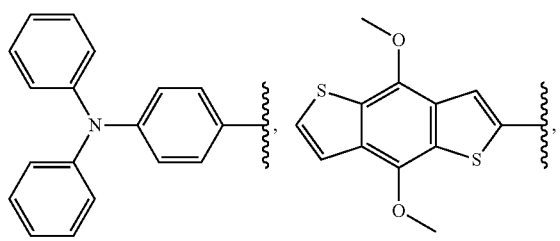

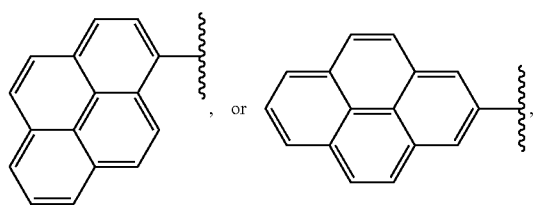

and the $\gamma_n$ at both ends of X consist of only thiophene(s).

7. The organic compound of claim 1, wherein the $\gamma_n$ at both ends of X comprise of one or more furans.

8. The organic compound of claim 7, wherein the $\gamma_n$ at both ends of X consist of only furan(s).

9. The organic compound of claim 1, wherein R1 and R2 independently have at least about 4 carbon atoms.

10. The organic compound of claim 1, wherein R1 and R2 independently have from about 4 to 40 carbon atoms.

11. The organic compound of claim 1, wherein R1 and R2 independently comprise at least 1 or 2 branch chains comprising from about 1 to 16 carbon atoms.

12. The organic compound of claim 1, wherein R1 and R2 independently are 2-ethylhexyl, 2-butyloctyl, 2-hexylddecyl, or 2-octyldodecyl.

13. The organic compound of claim 1, wherein R1 and R2 are identical.

14. The organic compound of claim 1, wherein $\alpha$ has at least one line of symmetry, or at least a 2-fold rotational symmetry.

15. The organic compound of claim 1, wherein the $\gamma_n$ at both ends of X comprise of one or more furans and $\alpha$ comprises from about one to eight benzenes.

16. The organic compound of claim 15, wherein $\alpha$ comprises from about one to four benzenes.

17. The organic compound of claim 1, $\alpha$ comprises one or more heteroatoms.

18. The organic compound of claim 1, wherein $\alpha$ comprises a polycyclic aromatic or partially aromatic hydrocarbon (PAH).

19. The organic compound of claim 1, wherein $\alpha$ comprises an acenaphthene, acenaphthylene, anthanthrene, anthracene, benz[a]anthracene, benzo[a]pyrene, benzo[e]pyrene, benzo[b]fluoranthene, benzo[ghi]perylene, benzo[j]fluoranthene, benzo[k]fluoranthene, benzopyrene, chrysene, coronene, corannulene, dibenz(a,h)anthracene, fluoranthene, hexabenzocoronene, indeno(1,2,3-cd)pyrene, naphthalene, ovalene, pentacene, pentaphene, perylene, phenanthrene, pyrene, tetracene, tetraphene, and triphenylene.

20. The organic compound of claim 1, wherein $\alpha$ comprises a

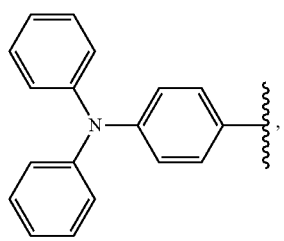

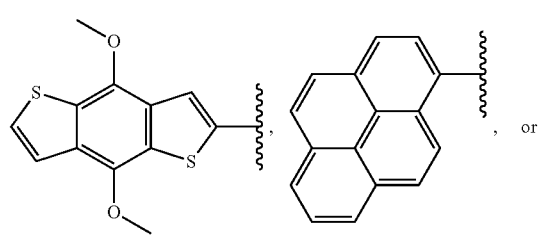

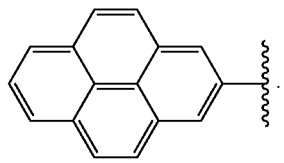

21. A plurality of the organic compound of claim 1, wherein each organic compound is π-stacked with at least one other organic compound.

22. A device comprising the organic compound of claim 1.

23. The device of claim 22, wherein the device is a light-emitting diode, thin-film transistor, chemical biosensor, non-emissive electrochromic, memory device, or photovoltaic cell.

24. The device of claim 23, wherein the device comprises (a) the organic compound as a p-type component, and (b) a suitable n-type component.

25. A photovoltaic device comprising a photoactive layer comprising the organic compound of claim 1 disposed between a first electrode and a second electrode.

26. The photovoltaic device of claim 25, wherein the first electrode is ITO.

27. The photovoltaic device of claim 25, wherein the second electrode is LiF/Al.

28. The photovoltaic device of claim 25, wherein the photoactive layer, the first electrode, and the second electrode are thin films.

29. The photovoltaic device of claim 28, wherein the device further comprises a substrate, wherein the thin films are disposed on the substrate.

30. The photovoltaic device of claim 29, wherein the substrate comprises glass.

31. The organic compound of claim 1, wherein the organic compound is:
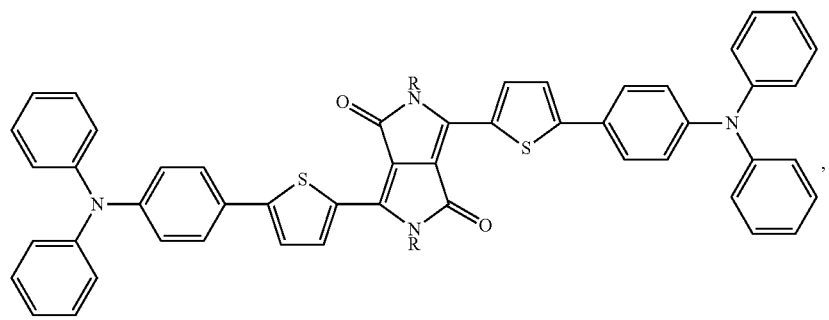
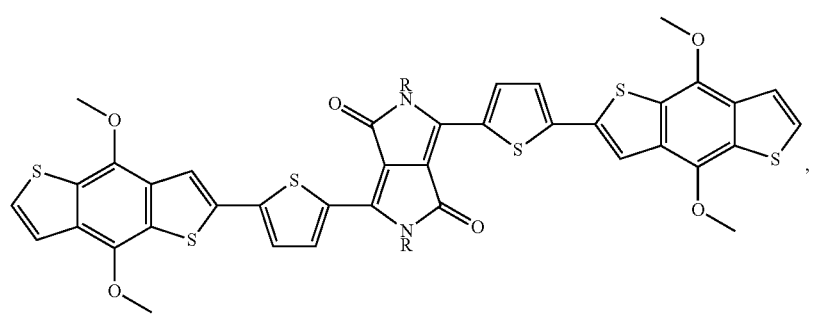
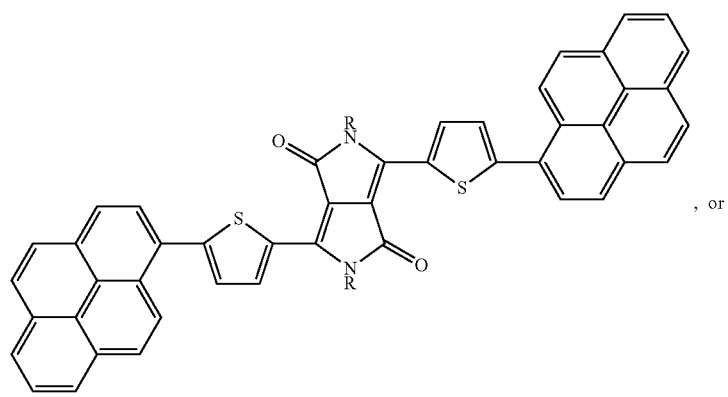, or
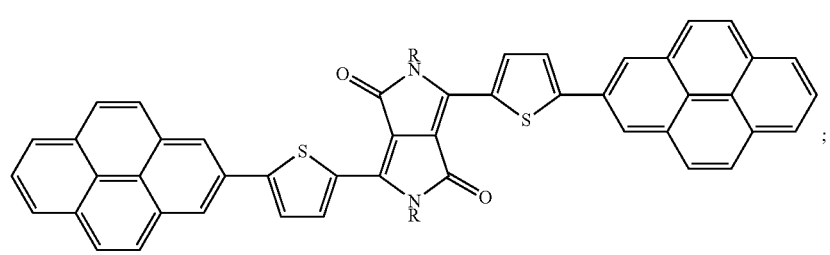;

wherein R is 2-octyldodecyl, 2-hexyldecyl, 2-butyloctyl, or 2-ethylhexyl.

32. An organic compound comprising the following structure: $\alpha$-$\gamma_n$-X-$\gamma_n$-$\alpha$; wherein X comprises a multi-ring organic structure comprising at least one benzene, imide, pyrrole, furan, or thiophene; each $\gamma$ is independently a thiophene, furan, or pyrrole; each n is independently an integer from 1 to 20; and, each $\alpha$ comprises a multi-ring aromatic structure which are each capable of $\pi$-stacking with the $\alpha$ of a second organic compound, wherein the organic compound and second organic compound can have identical or different chemical structures; wherein (a) the $\gamma_n$ at both ends of X comprise of one or more furans, or (b) $\alpha$ comprises an acenaphthene, acenaphthylene, anthanthrene, anthracene, benz[a]anthracene, benzo[a]pyrene, benzo[e]pyrene, benzo[b]fluoranthene, benzo[ghi]perylene, benzo[j]fluoranthene, benzo[k]fluoranthene, benzopyrene, chrysene, coronene, corannulene, dibenz(a,h)anthracene, fluoranthene, hexabenzocoronene, indeno(1,2,3-cd)pyrene, naphthalene, ovalene, pentacene, pentaphene, perylene, phenanthrene, pyrene, tetracene, tetraphene, triphenylene, 34. The organic compound of claim 33, wherein the $\gamma_n$ at both ends of X consist of only furan(s).

35. The organic compound of claim 32, wherein $\alpha$ comprises from about one to eight benzenes.

36. The organic compound of claim 35, wherein $\alpha$ comprises from about one to four benzenes.

37. The organic compound of claim 32, wherein $\alpha$ comprises a polycyclic aromatic or partially aromatic hydrocarbon (PAH).

38. The organic compound of claim 32, wherein $\alpha$ comprises an acenaphthene, acenaphthylene, anthanthrene, anthracene, benz[a]anthracene, benzo[a]pyrene, benzo[e]pyrene, benzo[b]fluoranthene, benzo[ghi]perylene, benzo[j]fluoranthene, benzo[k]fluoranthene, benzopyrene, chrysene, coronene, corannulene, dibenz(a,h)anthracene, fluoranthene, hexabenzocoronene, indeno(1,2,3-cd)pyrene, naphthalene, ovalene, pentacene, pentaphene, perylene, phenanthrene, pyrene, tetracene, tetraphene, and triphenylene.

39. The organic compound of claim 32, wherein $\alpha$ comprises a

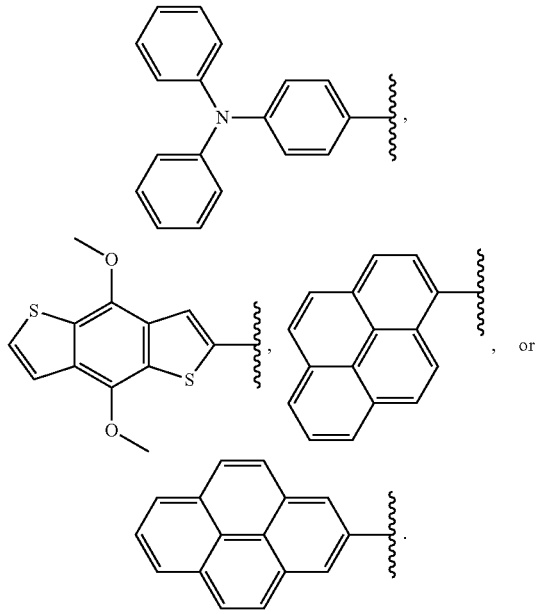

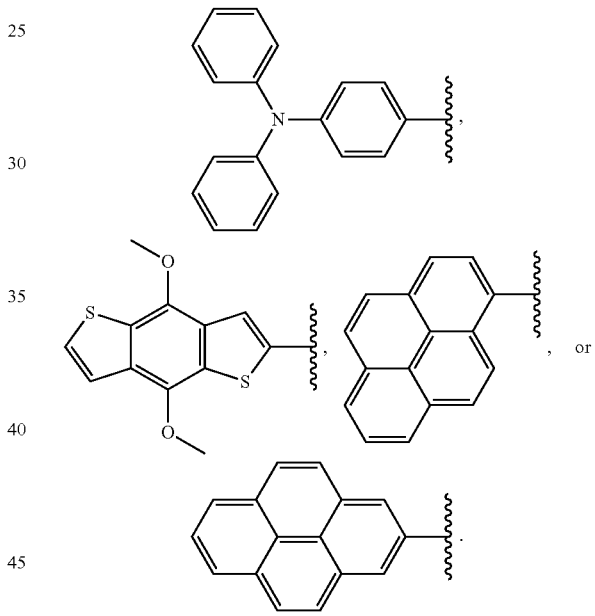

33. The organic compound of claim 32, wherein the $\gamma_n$ at both ends of X comprise of one or more furans.

* * * * *